(12) United States Patent
Li

(10) Patent No.: US 11,794,185 B2
(45) Date of Patent: Oct. 24, 2023

(54) MICROFLUIDIC SUBSTRATE AND MANUFACTURE METHOD THEREOF, MICROFLUIDIC PANEL

(71) Applicant: BOE Technology Group Co., Ltd., Beijing (CN)

(72) Inventor: Haixu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 800 days.

(21) Appl. No.: 16/761,948

(22) PCT Filed: Oct. 22, 2019

(86) PCT No.: PCT/CN2019/112490
§ 371 (c)(1),
(2) Date: May 6, 2020

(87) PCT Pub. No.: WO2020/140561
PCT Pub. Date: Jul. 9, 2020

(65) Prior Publication Data
US 2021/0308669 A1    Oct. 7, 2021

(30) Foreign Application Priority Data

Jan. 2, 2019  (CN) .......................... 201910002439.0

(51) Int. Cl.
*B01L 3/00*     (2006.01)
*G01N 29/02*    (2006.01)
(Continued)

(52) U.S. Cl.
CPC ..... *B01L 3/50273* (2013.01); *B01L 3/502707* (2013.01); *F04B 43/046* (2013.01);
(Continued)

(58) Field of Classification Search
None
See application file for complete search history.

(56) References Cited

U.S. PATENT DOCUMENTS

| 2004/0115097 A1* | 6/2004 | Wixforth | ................. G01N 1/40 |
| | | | 436/180 |
| 2006/0114296 A1* | 6/2006 | Gascoyne | ........... B01F 33/3021 |
| | | | 347/73 |

(Continued)

FOREIGN PATENT DOCUMENTS

| CN | 102896007 A | 1/2013 |
| CN | 105283753 A | 1/2016 |

(Continued)

*Primary Examiner* — Brian R Gordon
(74) *Attorney, Agent, or Firm* — Banner & Witcoff, Ltd.

(57) ABSTRACT

A microfluidic substrate and a manufacture method thereof, and a microfluidic panel are provided. The microfluidic substrate includes a base substrate, an acoustic wave generation device, and a first switching circuit. The acoustic wave generation device is on the base substrate and configured to emit an acoustic wave to drive a liquid droplet to move over the microfluidic substrates, the acoustic wave generation devices includes an acoustic wave driving electrode and an acoustic wave generation layer, the first switching circuit is on the base substrate, and the first switching circuit is electrically connected to the acoustic wave driving electrode and is configured to transmit an acoustic wave driving signal to the acoustic wave driving electrode, and the acoustic wave driving electrode is configured to drive the acoustic wave generation layer to generate the acoustic wave under control of the acoustic wave driving signal.

16 Claims, 13 Drawing Sheets

(51) Int. Cl.

| | |
|---|---|
| *F04B 43/04* | (2006.01) |
| *H01L 31/105* | (2006.01) |
| *H01L 31/08* | (2006.01) |
| *H10N 30/02* | (2023.01) |
| *H10N 30/06* | (2023.01) |
| *H10N 30/20* | (2023.01) |
| *H10N 30/80* | (2023.01) |
| *H10N 30/87* | (2023.01) |
| *H10N 30/88* | (2023.01) |
| *H10N 39/00* | (2023.01) |

(52) U.S. Cl.
  CPC ........... *G01N 29/022* (2013.01); *H01L 31/08* (2013.01); *H01L 31/105* (2013.01); *H10N 30/02* (2023.02); *H10N 30/06* (2023.02); *H10N 30/206* (2023.02); *H10N 30/802* (2023.02); *H10N 30/875* (2023.02); *H10N 30/883* (2023.02); *H10N 39/00* (2023.02); *B01L 2200/12* (2013.01); *B01L 2400/0436* (2013.01)

(56) References Cited

U.S. PATENT DOCUMENTS

| | | | | |
|---|---|---|---|---|
| 2008/0166793 | A1* | 7/2008 | Beer | C12Q 1/04 435/287.2 |
| 2009/0206171 | A1* | 8/2009 | Friend | B01L 3/502761 239/4 |
| 2010/0137163 | A1* | 6/2010 | Link | B01L 3/502784 506/40 |
| 2010/0206696 | A1* | 8/2010 | Kondoh | H02N 2/08 310/313 R |
| 2012/0149126 | A1* | 6/2012 | Wilson | C12N 13/00 436/175 |
| 2013/0213488 | A1* | 8/2013 | Weitz | B01L 3/502761 137/13 |
| 2013/0260447 | A1* | 10/2013 | Link | C12Q 1/686 435/283.1 |
| 2013/0330247 | A1* | 12/2013 | Wilson | G01N 1/286 422/504 |
| 2015/0192546 | A1* | 7/2015 | Weitz | B01L 3/502761 137/13 |
| 2017/0120249 | A1* | 5/2017 | Umbanhowar | C08B 15/05 |
| 2017/0246634 | A1* | 8/2017 | Weitz | B01F 33/3021 |
| 2018/0095067 | A1* | 4/2018 | Huff | G01N 33/48721 |
| 2018/0104694 | A1* | 4/2018 | Huff | B01L 3/502784 |
| 2018/0126381 | A1* | 5/2018 | Huff | G01N 33/54366 |
| 2018/0275088 | A1* | 9/2018 | Huff | B01L 3/502761 |
| 2019/0160445 | A1* | 5/2019 | Weitz | B01J 2/08 |
| 2020/0206738 | A1* | 7/2020 | Sung | B01L 3/50273 |
| 2021/0053053 | A1* | 2/2021 | Salmanzadeh | B01L 3/50273 |
| 2023/0003688 | A1* | 1/2023 | Song | B01L 3/00 |

FOREIGN PATENT DOCUMENTS

| | | |
|---|---|---|
| CN | 108704682 A | 10/2018 |
| CN | 109731621 A | 5/2019 |
| EP | 3437740 A1 | 2/2019 |
| JP | 2004340820 A | 12/2004 |
| WO | 2011126892 A2 | 10/2011 |

* cited by examiner

MICROFLUIDIC SUBSTRATE AND MANUFACTURE METHOD THEREOF, MICROFLUIDIC PANEL

CROSS-REFERENCE TO RELATED APPLICATION

The application is a U.S. National Phase Entry of International Application No. PCT/CN2019/112490 filed on Oct. 22, 2019, designating the United States of America and claiming priority to Chinese Patent Application No. 201910002439.0, filed on Jan. 2, 2019. The present application claims priority to and the benefit of the above-identified applications and the above-identified applications are incorporated by reference herein in their entirety.

TECHNICAL FIELD

Embodiments of the present disclosure relate to a microfluidic substrate and a manufacture method thereof, and a microfluidic panel.

BACKGROUND

Microfluidics technology refers to a technology that uses a micro-channel (tens to hundreds microns in size) to process or manipulate tiny fluids (nanoliter to attoliter in volume). A microfluidic chip is a main platform for achieving the microfluidics technology. The microfluidic chip has characteristics, such as parallel collection and processing of samples, high integration, high throughput, fast analysis speed, low power consumption, less material consumption, less pollution, and the like. The microfluidics technology can be applied in fields, such as biological genetic engineering, disease diagnosis and drug research, cell analysis, environmental monitoring and protection, health quarantine, judicial identification, etc.

SUMMARY

At least one embodiment of the present disclosure provides a microfluidic chip, the microfluidic substrate comprises: a base substrate, an acoustic wave generation device, and a first switching element; the acoustic wave generation device is on the base substrate and is configured to emit an acoustic wave to drive a liquid droplet to move over the microfluidic substrate, the acoustic wave generation device comprises an acoustic wave driving electrode and an acoustic wave generation layer, the first switching element is on the base substrate and electrically connected to the acoustic wave driving electrode, and is configured to transmit an acoustic wave driving signal to the acoustic wave driving electrode, and the acoustic wave driving electrode is configured to drive the acoustic wave generation layer to generate the acoustic wave under control of the acoustic wave driving signal.

For example, the microfluidic substrate provided by some embodiments of the present disclosure further comprises a first connection electrode and a first protective layer, which are on the base substrate; the acoustic wave driving electrode is located on a side of the acoustic wave generation layer away from the base substrate, and comprises at least one first sub-electrode; the first protective layer is located on a side of the acoustic wave generation device away from the base substrate, and comprises at least one first via hole, and each first via hole exposes a portion of a corresponding first sub-electrode; the first connection electrode is located on a side of the first protective layer away from the acoustic wave generation device, and is electrically connected to the at least one first sub-electrode through the at least one first via hole; and the first switching element is electrically connected to the at least one first sub-electrode through the first connection electrode.

For example, in the microfluidic substrate provided by some embodiments of the present disclosure, an orthographic projection of each first via hole on the base substrate is located within an orthographic projection of the corresponding first sub-electrode on the base substrate.

For example, the microfluidic substrate provided by some embodiments of the present disclosure further comprises a second connection electrode; the acoustic wave driving electrode further comprises at least one second sub-electrode, and the at least one first sub-electrode and the at least one second sub-electrode are electrically insulated from each other; the first protective layer further comprises at least one second via hole, and each second via hole exposes a portion of a corresponding second sub-electrode; and the second connection electrode is located on the side of the first protective layer away from the acoustic wave generation device, and is electrically connected to the at least one second sub-electrode through the at least one second via hole, and is configured to provide a common voltage signal to the at least one second sub-electrode.

For example, in the microfluidic substrate provided by some embodiments of the present disclosure, an orthographic projection of each second via hole on the base substrate is located within an orthographic projection of the corresponding second sub-electrode on the base substrate.

For example, in the microfluidic substrate provided by some embodiments of the present disclosure, the acoustic wave driving electrode comprises a plurality of first sub-electrodes and a plurality of second sub-electrodes, the plurality of first sub-electrodes and the plurality of second sub-electrodes are alternately arranged, and the plurality of first sub-electrodes and the plurality of second sub-electrodes are parallel to each other.

For example, in the microfluidic substrate provided by some embodiments of the present disclosure, the first protective layer includes a plurality of first via holes and a plurality of second via holes, and the plurality of first via holes are in one-to-one correspondence to the plurality of first sub-electrodes, and the plurality of second via holes are in one-to-one correspondence to the plurality of second sub-electrodes.

For example, the microfluidic substrate provided by some embodiments of the present disclosure further comprises a first composite electrode and a first protective layer, which are on the base substrate; the acoustic wave driving electrode comprises at least one first sub-electrode; the first protective layer is located on a side of the acoustic wave generation layer away from the base substrate and comprises at least one first groove, and the at least one first groove exposes a portion of the acoustic wave generation layer; the first composite electrode is located on a side of the first protective layer away from the acoustic wave generation layer and covers the at least one first groove, a portion of the first composite electrode located in the at least one first groove is the at least one first sub-electrode, and a portion of the first composite electrode located outside the at least one first groove is a first connection electrode; and the first switching element is electrically connected to the first connection electrode.

For example, the microfluidic substrate provided by some embodiments of the present disclosure further comprises a second composite electrode; the acoustic wave driving electrode further comprises at least one second sub-electrode, the first protective layer further comprises at least one second groove, and the at least one second groove exposes a portion of the acoustic wave generation layer; the second composite electrode is located on a side of the first protective layer away from the acoustic wave generation layer and covers the at least one second groove, a portion of the second composite electrode located in the at least one second groove is the at least one second sub-electrode, and a portion of the second composite electrode located outside the at least one second groove is a second connection electrode; and the second connection electrode is configured to receive a common voltage signal.

For example, in the microfluidic substrate provided by some embodiments of the present disclosure, the first protective layer includes a plurality of first grooves and a plurality of second grooves, the plurality of first grooves and the plurality of second grooves are alternately arranged, and the plurality of first grooves and the plurality of second grooves are parallel to each other.

For example, the microfluidic substrate provided by some embodiments of the present disclosure further comprises a second protective layer and a third via hole; the second protective layer is located on the first switching element; the acoustic wave generation device is located on the second protective layer and on a side of the second protective layer away from the first switching element; the first protective layer also covers the second protective layer; the third via hole penetrates through the second protective layer and the first protective layer and exposes a portion of the first switching element; and the first connection electrode is electrically connected to the first switching element through the third via hole.

For example, the microfluidic substrate provided by some embodiments of the present disclosure further comprises a signal detection device and a second switching element, which are on the base substrate, the signal detection device is electrically connected to the second switching element, and the first protective layer also covers the signal detection device and the second switching element.

For example, the microfluidic substrate provided by some embodiments of the present disclosure further comprises a passivation layer; the signal detection device comprises a semiconductor stack layer, a first driving electrode, and a second driving electrode; the passivation layer covers the second switching element, the first driving electrode is located on a side of the passivation layer away from the second switching element, the semiconductor stack layer is located on a side of the first driving electrode away from the passivation layer, the second driving electrode is located on a side of the semiconductor stack layer away from the first driving electrode, and the second protective layer covers the second driving electrode; and the passivation layer comprises a fourth via hole, and the first driving electrode is electrically connected to the second switching element through the fourth via hole.

For example, the microfluidic substrate provided by some embodiments of the present disclosure further comprises a detection signal line, the second protective layer comprises a fifth via hole, and the fifth via hole exposes a portion of the second driving electrode; and the detection signal line is located on a side of the second protective layer away from the second driving electrode and is electrically connected to the second driving electrode through the fifth via hole.

For example, in the microfluidic substrate provided by some embodiments of the present disclosure, the detection signal line and the acoustic wave driving electrode are on a same layer and are manufactured by a same material.

For example, in the microfluidic substrate provided by some embodiments of the present disclosure, the acoustic wave generation device and the signal detection device are spaced apart in a direction parallel to a surface of the base substrate.

For example, in the microfluidic substrate provided by some embodiments of the present disclosure, the acoustic wave generation layer comprises a piezoelectric material, and the acoustic wave driving electrode is configured to drive the piezoelectric material in the acoustic wave generation layer to generate the acoustic wave.

At least one embodiment of the present disclosure also provides a microfluidic panel comprising the microfluidic substrate according to any one of the above embodiments.

For example, in the microfluidic panel provided by some embodiments of the present disclosure, the microfluidic substrate includes a plurality of acoustic wave generation devices and a plurality of signal detection devices, and the plurality of acoustic wave generation devices surround the plurality of signal detection devices.

For example, in the microfluidic panel provided by some embodiments of the present disclosure, the plurality of acoustic wave generation devices and the plurality of signal detection devices constitute a plurality of repeating units, each repeating unit includes two acoustic wave generation devices and one signal detection device, the two acoustic wave generation devices and the one signal detection device are arranged in a first direction, the plurality of repeating units are arranged in a second direction to form a plurality of repeating unit groups, and the first direction and the second direction are not parallel.

At least one embodiment of the present disclosure also provides a manufacture method for manufacturing a microfluidic substrate, comprising: providing a base substrate; forming an acoustic wave generation device and a first switching element on the base substrate, where the acoustic wave generation device is configured to emit an acoustic wave to drive a liquid droplet to move over the microfluidic substrate, the acoustic wave generation device comprises an acoustic wave driving electrode and an acoustic wave generation layer, the first switching element is electrically connected to the acoustic wave driving electrode, the first switching element is configured to transmit an acoustic wave driving signal to the acoustic wave driving electrode, and the acoustic wave driving electrode is configured to drive the acoustic wave generation layer to generate the acoustic wave under control of the acoustic wave driving signal.

For example, the manufacture method provided by some embodiments of the present disclosure further comprises: forming the acoustic wave generation device on the base substrate on which the first switching element is formed, where the acoustic wave driving electrode is located on a side of the acoustic wave generation layer away from the base substrate, and comprises at least one first sub-electrode; and forming a first protective layer, where the first protective layer is located on a side of the acoustic wave generation device away from the base substrate, the first protective layer comprises at least one first via hole, and each first via hole exposes a portion of a corresponding first sub-electrode; and forming a first connection electrode on a side of the first protective layer away from the acoustic wave generation device, where the first connection electrode is electrically connected to the at least one first sub-electrode through the at least one first via hole, and the first switching element is electrically connected to the at least one first sub-electrode through the first connection electrode.

For example, the manufacture method provided by some embodiments of the present disclosure further comprises: forming the acoustic wave generation layer of the acoustic wave generation device on the base substrate on which the first switching element is formed; forming a first protective layer, where the first protective layer is located on a side of the acoustic wave generation layer away from the base substrate and comprises at least one first groove, and the at least one first groove exposes a portion of the acoustic wave generation layer; and forming a first composite electrode on a side of the first protective layer away from the acoustic wave generation layer, where the first composite electrode covers the at least one first groove, the acoustic wave driving electrode comprises at least one first sub-electrode, a portion of the first composite electrode located in the at least one first groove is the at least one first sub-electrode, a portion of the first composite electrode located outside the at least one first groove is a first connection electrode, and the first switching element is electrically connected to the first connection electrode.

For example, the manufacture method provided by some embodiments of the present disclosure further comprises: forming a second switching element on the base substrate; and forming a signal detection device on the base substrate on which the second switching element is formed. The first protective layer also covers the signal detection device and the second switching element, and the signal detection device is electrically connected to the second switching element.

For example, the manufacture method provided by some embodiments of the present disclosure further comprises: forming a detection signal line on the base substrate, the detection signal line is electrically connected to the signal detection device, and the detection signal line and the acoustic wave driving electrode are formed by one patterning process.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

Figure 1:
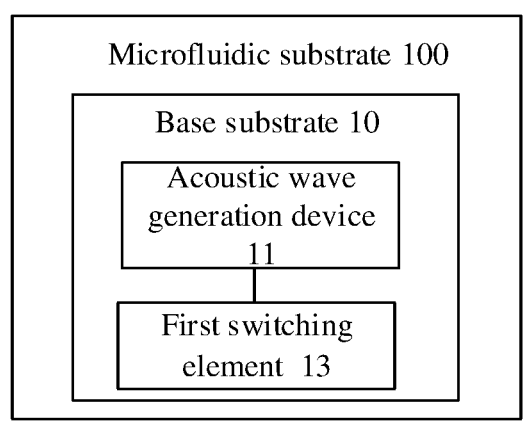
FIG. 1 is a schematic block diagram of a microfluidic substrate provided by some embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

In order to keep the following description of embodiments of the present disclosure clear and concise, the present disclosure omits detailed descriptions of some known functions and known components.

An analysis and detection system based on a microfluidic chip has become an important direction of the development of analysis instruments. Traditional microfluidic systems can etch microchannels on a surface of glass substrates by hot rolling or polymer methods, and apply a large pressure difference across a liquid droplet to drive the liquid droplet to move. Therefore, the micro-pump must output a large amount of energy, which is difficult to be achieved in the microchannel with a small diameter. The liquid droplet can also be driven to move along the microchannel by electrophoresis and other methods. In this case, because of using the distribution of ions in the liquid droplet to drive the liquid droplet to flow, it causes the strong dependence on the ion content in the liquid droplet when driving the liquid droplet to flow. In addition, in the microchannel, the Reynolds number of fluids is very small, and the liquid droplet will show a larger viscosity, thus increasing the difficulty in control of the microfluidic in biological or chemical reactions.

At least one embodiment of the present disclosure provides a microfluidic substrate and a manufacture method thereof, and a microfluidic panel. By setting an acoustic wave generation device on the microfluidic substrate, it can be achieved that a liquid droplet is driven to move over a surface of the microfluidic chip by the acoustic wave (such as ultrasonic waves, etc.), thereby reducing the dependency on ionic components in the liquid droplet, and driving more kinds of liquid droplets; a driving force can be increased, and the liquid droplet as small as picoliter level can be driven; and in addition, the acoustic wave can be superimposed on the surface of the microfluidic chip to form forces in different directions to achieve surface free direction driving.

Embodiments of the present disclosure are described in detail below with reference to the accompanying drawings, but the present disclosure is not limited to these specific embodiments.

Figure 2A:
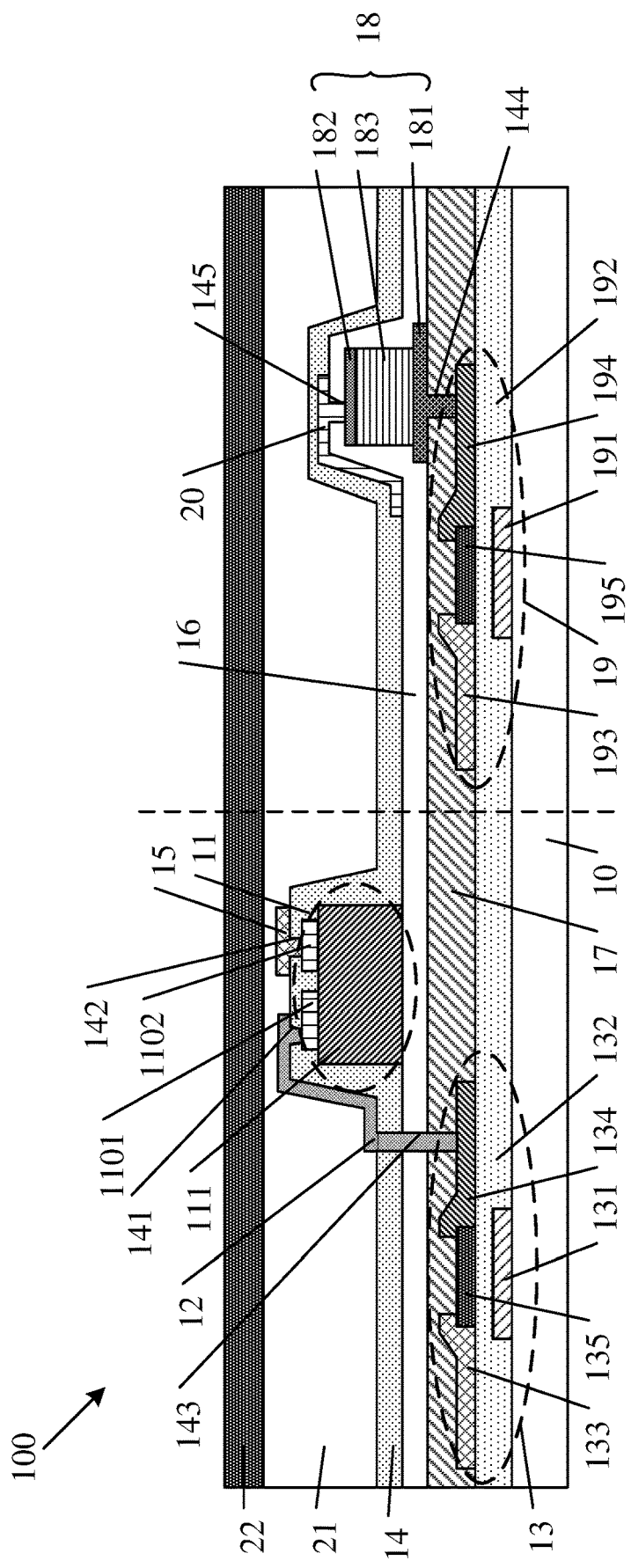
FIG. 2A is a cross-sectional structural schematic diagram of a microfluidic substrate provided by some embodiments of the present disclosure.
Figure 3A:
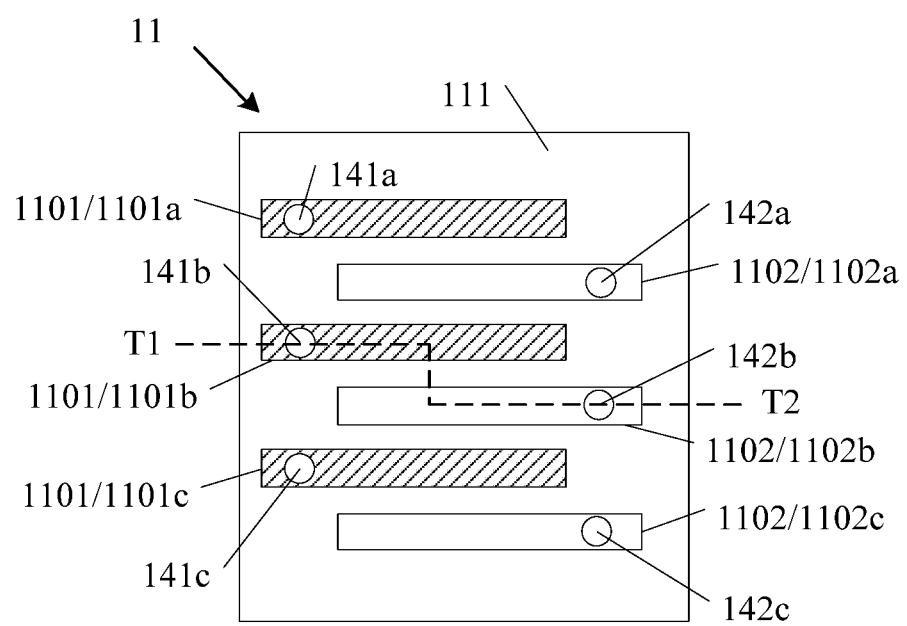
FIG. 3A is a plane structural schematic diagram of an acoustic wave generation device provided by some embodiments of the present disclosure.

FIG. 1 is a schematic block diagram of a microfluidic substrate provided by some embodiments of the present disclosure, FIG. 2A is a cross-sectional structural schematic diagram of a microfluidic substrate provided by some embodiments of the present disclosure, and FIG. 3A is a plane structural schematic diagram of an acoustic wave generation device provided by some embodiments of the present disclosure.

For example, as shown in FIG. 1, in the embodiment of the present disclosure, a microfluidic substrate 100 includes a base substrate 10 and an acoustic wave generation device 11. The acoustic wave generation device 11 is directly manufactured on the base substrate 10 by, for example, a semiconductor process, so that the acoustic wave generation device 11 is disposed on the base substrate 10, and the acoustic wave generation device 11 is configured to emit an acoustic wave to drive a liquid droplet to move over the microfluidic substrate 100.

For example, as shown in FIG. 1, the microfluidic substrate 100 further includes a first switching element 13. The first switching element 13 is also on the base substrate 10. The acoustic wave generation device 11 includes an acoustic wave driving electrode and an acoustic wave generation layer. The first switching element 13 is electrically connected to the acoustic wave driving electrode and is configured to transmit an acoustic wave driving signal to the acoustic wave driving electrode, and the acoustic wave driving electrode is configured to drive the acoustic wave generation layer to generate the acoustic wave under control of the acoustic wave driving signal.

For example, as shown in FIG. 2A, in some embodiments, the microfluidic substrate 100 further includes a first connection electrode 12, a first switching element 13, and a first protective layer 14. The first connection electrode 12, the first switching element 13, and the first protective layer 14 are all disposed on the base substrate 10.

As shown in FIGS. 2A and 3A, the acoustic wave generation device 11 includes the acoustic wave driving electrode and the acoustic wave generation layer 111, and the acoustic wave driving electrode is located on a side of the acoustic wave generation layer 111 away from the base substrate 10. The acoustic wave driving electrode is an interdigital electrode and includes at least one first sub-electrode 1101.

The first protective layer 14 is located on a side of the acoustic wave generation device 11 away from the base substrate 10. For example, the first protective layer 14 covers the acoustic wave generation device 11. The first protective layer 14 includes at least one first via hole 141, and the first via hole 141 exposes a portion of a corresponding first sub-electrode 1101. The first protective layer 14 is made of an insulating material.

The first connection electrode 12 is located on a side of the first protective layer 14 away from the acoustic wave generation device 11, and is electrically connected to the at least one first sub-electrode 1101 through the at least one first via hole 141. The first connection electrode 12 is prepared of a conductive material, and the conductive material may include a transparent conductive material, a metal material, or other suitable materials, and the transparent conductive material may include indium tin oxide (ITO) or the like.

The first switching element 13 is electrically connected to the at least one first sub-electrode 1101 through the first connection electrode 12. The first switching element 13 is configured to transmit the acoustic wave driving signal to the first sub-electrode 1101 in the case where the first switching element 13 is turned on, and the acoustic wave driving signal may be an alternating current (AC) electrical signal. For example, the first connection electrode 12 is in direct contact with the first switching element 13 to achieve electrical connection.

It should be noted that the acoustic wave generation device and the first protective layer corresponding to the acoustic wave generation device as shown in the cross-sectional structural schematic diagram of FIG. 2A are cross-sectional schematic diagram obtained according to a dashed line T1-T2 in FIG. 3A.

Figure 4A:
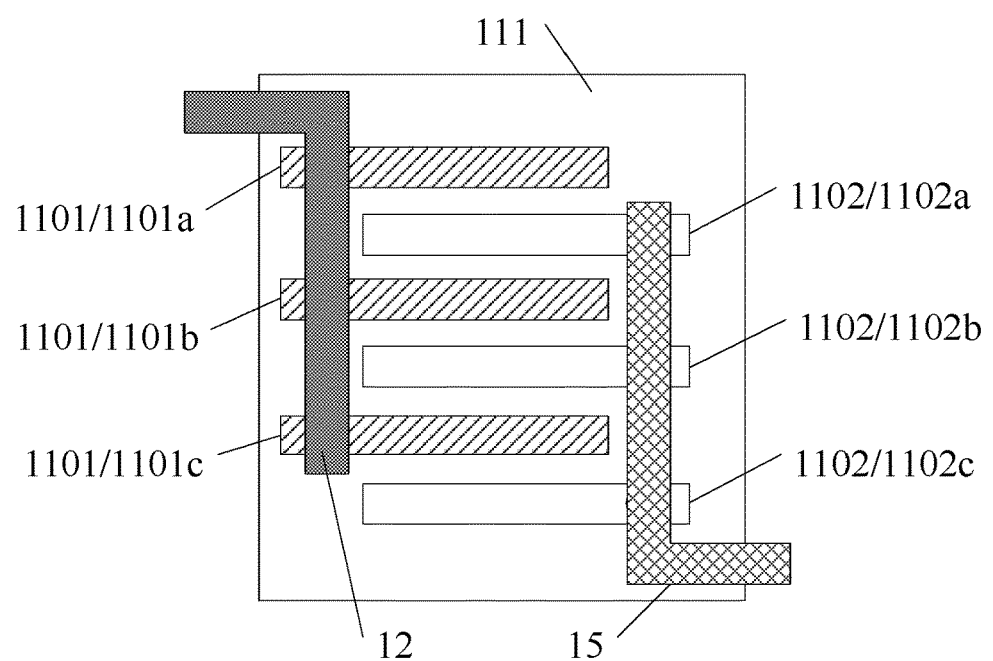
FIG. 4A is a plane structural schematic diagram of an acoustic wave generation device, a first connection electrode, and a second connection electrode provided by some embodiments of the present disclosure.

FIG. 4A is a plane schematic diagram of an acoustic wave generation device, a first connection electrode, and a second connection electrode provided by some embodiments of the present disclosure.

For example, as shown in FIGS. 2A, 3A, and 4A, the microfluidic substrate 100 further includes a second connection electrode 15. The acoustic wave driving electrode further includes at least one second sub-electrode 1102, and the at least one first sub-electrode 1101 and the at least one second sub-electrode 1102 are electrically insulated from each other. The first protective layer 14 further includes at least one second via hole 142, and the second via hole 142 exposes a portion of a corresponding second sub-electrode 1102. The second connection electrode 15 is also located on the side of the first protective layer 14 away from the acoustic wave generation device 11, the second connection electrode 15 is electrically connected to the at least one second sub-electrode 1102 through the at least one second via hole 142 and is configured to provide a common voltage signal to the at least one second sub-electrode 1102. For example, the second connection electrode 15 is connected to a common signal line to receive the common voltage signal (for example, the common voltage signal may be shared by a plurality of acoustic wave generation devices). The common voltage signal may also be an AC electrical signal. The common voltage signal applied to the second sub-electrode 1102 and the acoustic wave driving signal applied to the first sub-electrode 1101 cooperate to generate an AC electrical field, and the AC electrical field is used for driving the acoustic wave generation layer 111 to generate the acoustic wave.

For example, the acoustic wave generation layer 111 may include a piezoelectric material. The piezoelectric material may include piezoelectric ceramics, lithium niobate, quartz, lead titanate, and other piezoelectric crystals.

For example, the acoustic wave driving electrode is in direct contact with the acoustic wave generation layer 111. As shown in FIG. 2A, the first sub-electrode 1101 and the second sub-electrode 1102 are directly disposed on the acoustic wave generation layer 111 to be in direct contact with the acoustic wave generation layer 111.

For example, the acoustic wave driving electrode is configured to drive the acoustic wave generation layer 111 to generate the acoustic wave, and for example, the acoustic wave driving electrode is configured to drive the piezoelectric material in the acoustic wave generation layer 111 to generate the acoustic wave. In the case where different AC electrical signals are applied to the first sub-electrode 1101 and the second sub-electrode 1102 of the acoustic wave driving electrode, respectively, under the action of the alternating current electrical field formed by the first sub-electrode 1101 and the second sub-electrode 1102, the surface of the acoustic wave generation layer 111 generates mechanical vibration and simultaneously excites a surface acoustic wave corresponding to a frequency of the applied alternating current electrical signal, and the surface acoustic wave has good resonance performance. The surface acoustic wave is an elastic wave that is generated and propagates on the surface of the acoustic wave generation layer 111, and the amplitude of the surface acoustic wave decreases rapidly as the depth of the surface acoustic wave into the acoustic wave generation layer 111 increases. The surface acoustic wave is transmitted to the liquid droplet to be driven, and a driving force is generated on the liquid droplet to drive the liquid droplet to move along a predetermined direction. For example, the greater the frequency of the applied AC electrical signal, the greater the frequency of the generated surface acoustic wave, and the greater the energy of the surface acoustic wave, and therefore, the greater the driving force generated on the liquid droplet. The embodiments of the present disclosure do not limit the frequency of the surface acoustic wave, for example, the surface acoustic wave may be an ultrasonic.

Figure 5:
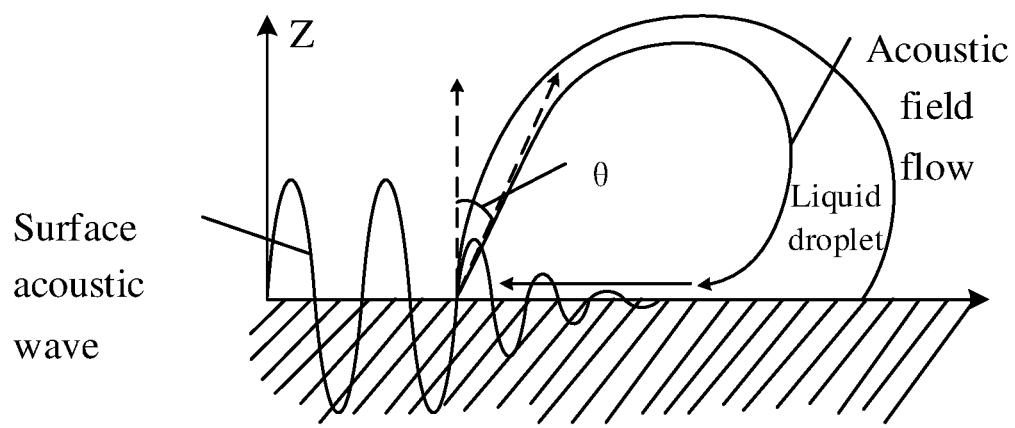
FIG. 5 is a principle schematic diagram of a surface acoustic wave driving a liquid droplet provided by some embodiments of the present disclosure.

FIG. 5 is a principle schematic diagram of a surface acoustic wave driving a liquid droplet provided by some embodiments of the present disclosure. As shown in FIG. 5, because the surface acoustic wave has a vibration displacement component perpendicular to the surface of the acoustic wave generation layer 111 (i.e., perpendicular to the surface of the base substrate 10), in the case where the vibration displacement component contacts the liquid droplet, the vibration displacement component is converted into a longitudinal wave that enters the liquid droplet at a refraction angle θ. An acoustic field flow formed by the longitudinal wave inside the liquid droplet is related to factors, such as a power of the surface acoustic wave, a frequency of the surface acoustic wave, a size of the liquid droplet, and the like. The acoustic field flow also generates an acoustic pressure difference on both sides of the liquid droplet. The acoustic pressure difference first deforms the liquid droplet, and in the case where the acoustic pressure difference is greater than a critical force that overcomes a friction and surface tension between the liquid droplet and the surface of the microfluidic chip and other actions, the liquid droplet will move along a propagation direction of the surface acoustic wave. For example, the driving force Fs, which drives the liquid droplet to move over the surface of the microfluidic chip, of the surface acoustic wave is expressed as:

$$F_s = 2 \cdot R \cdot \gamma \cdot \sin\left(\frac{\theta_a + \theta_r}{2}\right) \cdot (\cos\theta_r - \cos\theta_a)$$

where R represents a radius of the driven liquid droplet, γ represents a surface tension of a liquid/gas interface, and θa and θr respectively represents a advancing contact angle and a receding contact angle of the driven liquid droplet due to a wetting hysteresis phenomenon.

For example, the surface acoustic wave generates a large driving force on the liquid droplet, and can drive the liquid droplet as small as picoliter level. In the case where the surface acoustic wave is used to drive the liquid droplet, the dependence on the composition of a sample in the liquid droplet is low, so that the surface acoustic wave can drive a plurality of different types of liquid droplets; and a plurality of surface acoustic waves generated by a plurality of acoustic wave generation devices can be superimposed to generate driving forces in various directions so as to achieve free movement of driving liquid droplets over the surface of the microfluidic substrate 100.

Figure 6:
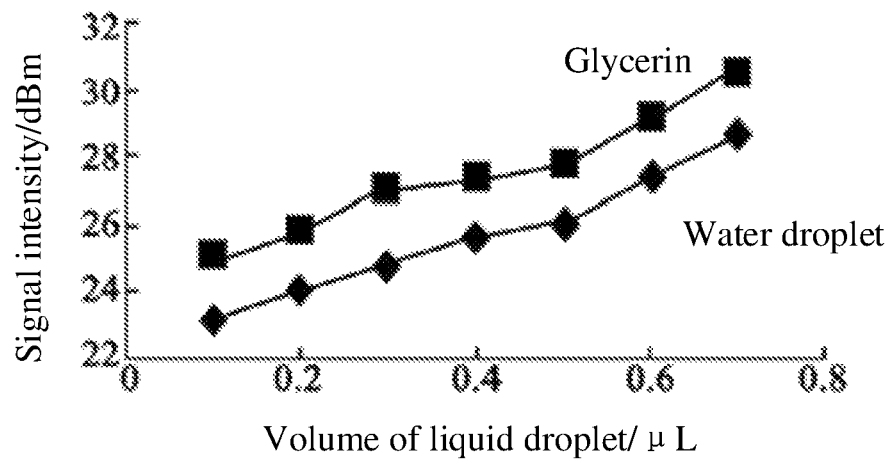
FIG. 6 is a schematic diagram showing a relationship between a signal intensity of an alternating current electrical signal and a volume of a liquid droplet provided by some embodiments of the present disclosure.

FIG. 6 is a schematic diagram showing a relationship between a signal intensity of the AC electrical signal and a volume of the liquid droplet provided by some embodiments of the present disclosure. As shown in FIG. 6, for the same liquid droplet (e.g., water droplet), the larger the volume of the liquid droplet, the signal intensity of the required AC electrical signal increases as the volume of the liquid droplet increases. In the case where the volume of the liquid droplet is constant, the higher the signal intensity of the AC electrical signal, the faster the liquid droplet moves. For different liquid droplets (e.g., water droplets and glycerin), the signal intensity of the required AC electrical signal is also different. Because the viscosity coefficient of the glycerin is larger than the viscosity coefficient of the water droplet, for the water droplet and the glycerin that have the same volume, the signal intensity of the AC electrical signal required to drive the glycerin is larger than the signal intensity of the AC electrical signal required to drive the water droplet. For example, as shown in FIG. 6, in the case where the volume of the water droplet and the volume of the glycerin are both 0.2 microliters, the signal intensity of the AC electrical signal required to drive the glycerin is about 26 dBm, while the signal intensity of the AC electrical signal required to drive the water droplet is about 24 dBm.

For example, as shown in FIG. 3A, an orthographic projection of each first via hole 141 on the base substrate 10 is located within an orthographic projection of the corresponding first sub-electrode 1101 on the base substrate 10 to ensure that the surface of the acoustic wave generation layer 111 in the acoustic wave generation device 11 will not be damaged in the case where the first via hole 141 is formed.

An orthographic projection of each second via hole 142 on the base substrate 10 is located within an orthographic projection of the corresponding second sub-electrode 1102 on the base substrate 10 to ensure that the surface of the acoustic wave generation layer 111 in the acoustic wave generation device 11 will not be damaged in the case where the second via hole 142 is formed. Therefore, in the embodiment as shown in FIG. 2A, in the microfluidic substrate 100, by providing the acoustic wave driving electrode on the surface of the acoustic wave generation device, it is possible to prevent damage to the acoustic wave generation layer in the acoustic wave generation device in the process of etching the via hole in the first protective layer, thereby stabilizing a current signal transmitted to the acoustic wave generation device, and having the characteristics of stabilizing and improving the ability of the acoustic wave micropump to control liquid droplet flow, etc.

For example, the first connection electrode 12 and the second connection electrode 15 are located on the same layer and insulated from each other. The first connection electrode 12 and the second connection electrode 15 may be prepared of the same material and formed by the same conductive film through one patterning process. The embodiments of the present disclosure are not limited thereto.

For example, as shown in FIG. 3A, the acoustic wave driving electrode includes a plurality of first sub-electrodes 1101 and a plurality of second sub-electrodes 1102. In the example as shown in FIG. 3A, the acoustic wave driving electrode includes three first sub-electrodes 1101 and three second sub-electrodes 1102, the three first sub-electrodes 1101 are a first sub-electrode 1101a, a first sub-electrode 1101b, and a first sub-electrode 1101c, respectively, and the three second sub-electrodes 1102 are a second sub-electrode 1102a, a second sub-electrode 1102b, and a second sub-electrode 1102c, respectively.

For example, the plurality of first sub-electrodes 1101 and the plurality of second sub-electrodes 1102 are alternately arranged, for example, there is only one second sub-electrode 1102 between any two first sub-electrodes 1101, and correspondingly, there is only one first sub-electrode 1101 between any two second sub-electrodes 1102. In the example as shown in FIG. 3A, the second sub-electrode 1102a is located between the first sub-electrode 1101a and the first sub-electrode 1101b, the first sub-electrode 1101b is located between the second sub-electrode 1102a and the second sub-electrode 1102b, the second sub-electrode 1102b is located between the first sub-electrode 1101b and the first sub-electrode 1101c, and the first sub-electrode 1101c is located between the second sub-electrode 1102b and the second sub-electrode 1102c.

For example, the plurality of first sub-electrodes 1101 and the plurality of second sub-electrodes 1102 are arranged in parallel.

For example, the plurality of first sub-electrodes 1101 and the plurality of second sub-electrodes 1102 are located on the same layer and are formed by the same conductive film through one patterning process. The plurality of first sub-electrodes 1101 and the plurality of second sub-electrodes 1102 are made of the same material (e.g., indium tin oxide, etc.).

For example, the shapes and sizes of the plurality of first sub-electrodes 1101 are all the same, and the shapes and sizes of the plurality of second sub-electrodes 1102 are all the same. The first sub-electrode 1101 and the second sub-electrode 1102 have the same shape and size. For example, as shown in FIG. 3A, the shape of each first sub-electrode 1101 is a rectangle, a width of the rectangle is 5-10 μm, and a length of the rectangle is related to the size of the acoustic wave generation device 11. However, the present disclosure is not limited to this case, and the shape of the first sub-electrode 1101 may be zigzag, wavy, or the like. In addition, the number of first sub-electrodes 1101 and the number of second sub-electrodes 1102 are also related to the size of the acoustic wave generation device 11.

For example, as shown in FIG. 3A, the first protective layer 14 includes a plurality of first via holes 141 and a plurality of second via holes 142. Each first sub-electrode 1101 corresponds to at least one first via hole 141, thereby ensuring that the first connection electrode 12 can be electrically connected to all the first sub-electrodes 1101 through the first via holes 141. Each second sub-electrode 1102 corresponds to at least one second via hole 142, thereby ensuring that the second connection electrode 15 can be electrically connected to all the second sub-electrodes 1102 through the second via holes 142.

For example, in some examples, the plurality of first via holes 141 are in one-to-one correspondence to the plurality of first sub-electrodes 1101, and the plurality of second via holes 142 are in one-to-one correspondence to the plurality of second sub-electrodes 1102. As shown in FIG. 3A, the first protective layer 14 includes three first via holes 141 and three second via holes 142, the three first via holes 141 are a first via hole 141a, a first via hole 141b, and a first via hole 141c, respectively, and the three second via holes 142 are a second via hole 142a, a second via hole 142b, and a second via hole 142c, respectively. The first via hole 141a corresponds to the first sub-electrode 1101a, the first via hole 141b corresponds to the first sub-electrode 1101b, and the first via hole 141c corresponds to the first sub-electrode 1101c. The second via hole 142a corresponds to the second sub-electrode 1102a, the second via hole 142b corresponds to the second sub-electrode 1102b, and the second via hole 142c corresponds to the second sub-electrode 1102c.

For example, in other examples, each first sub-electrode 1101 corresponds to a plurality of (e.g., two, three, etc.) first via holes 141, and the first connection electrode 12 is connected to the first sub-electrode 1101 through the plurality of first via holes 141, so that a contact resistance between the first connection electrode 12 and the first sub-electrode 1101 can be reduced. Each second sub-electrode 1102 corresponds to a plurality of (e.g., two, three, etc.) second via holes 142, and the second connection electrode 15 is connected to the second sub-electrode 1102 through the plurality of second via holes 142, so that a contact resistance between the second connection electrode 15 and the second sub-electrode 1102 can be reduced.

For example, the shapes and sizes of the plurality of first via holes 141 are the same, and the shapes and sizes of the plurality of second via holes 142 are also the same. The shape of the first via hole 141 and the shape of the second via hole 142 are the same, the size of the first via hole 141 and the size of the second via hole 142 are the same. For example, the shape of the first via hole 141 may be a circular, and a diameter of the circular is 2-8 microns. However, the embodiments of the present disclosure are not limited to this case. The shapes of the first via hole 141 and the second via hole 142 may also be rectangular, etc. The embodiments of the present disclosure do not specifically limit the shapes of the first via hole 141 and the second via hole 142.

In other examples, the plurality of first sub-electrodes 1101 may constitute comb-shaped electrodes (not shown), that is, the plurality of first sub-electrodes 1101 are electrically connected to each other through an electrode strip crossing the plurality of first sub-electrodes 1101, and then are electrically connected to the first connection electrode through the first via hole 141. In this case, the first protective layer 14 may include only one first via hole 141, and the first via hole 141 may expose a portion of the electrode strip crossing the plurality of first sub-electrodes 1101. Similarly, the plurality of second sub-electrodes 1102 may constitute comb-shaped electrodes (not shown), that is, the plurality of second sub-electrodes 1102 are electrically connected to each other through an electrode strip crossing the plurality of second sub-electrodes 1102, and then are electrically connected to the second connection electrode through the second via hole 142. In this case, the first protective layer 14 may include only one second via hole 142, and the second via hole 142 may expose a portion of the electrode strip crossing the plurality of second sub-electrodes 1102.

In other embodiments, the plurality of first sub-electrodes 1101 may be formed on the side of the acoustic wave generation layer 111 of the acoustic wave generation device 11 away from the base substrate 10, and the plurality of second sub-electrodes 1102 may be formed on a side of the acoustic wave generation layer 111 of the acoustic wave generation device 11 close to the base substrate 10, whereby the plurality of first sub-electrodes 1101 and the plurality of second sub-electrodes 1102 sandwich the acoustic wave generation layer 111 of the acoustic wave generation device 11 between the plurality of first sub-electrodes 1101 and the plurality of second sub-electrodes 1102. In the case where voltage signals are applied to the plurality of first sub-electrodes 1101 and the plurality of second sub-electrodes 1102, the acoustic wave generation layer 111 can be driven to vibrate to generate the acoustic wave.

Figure 2B:
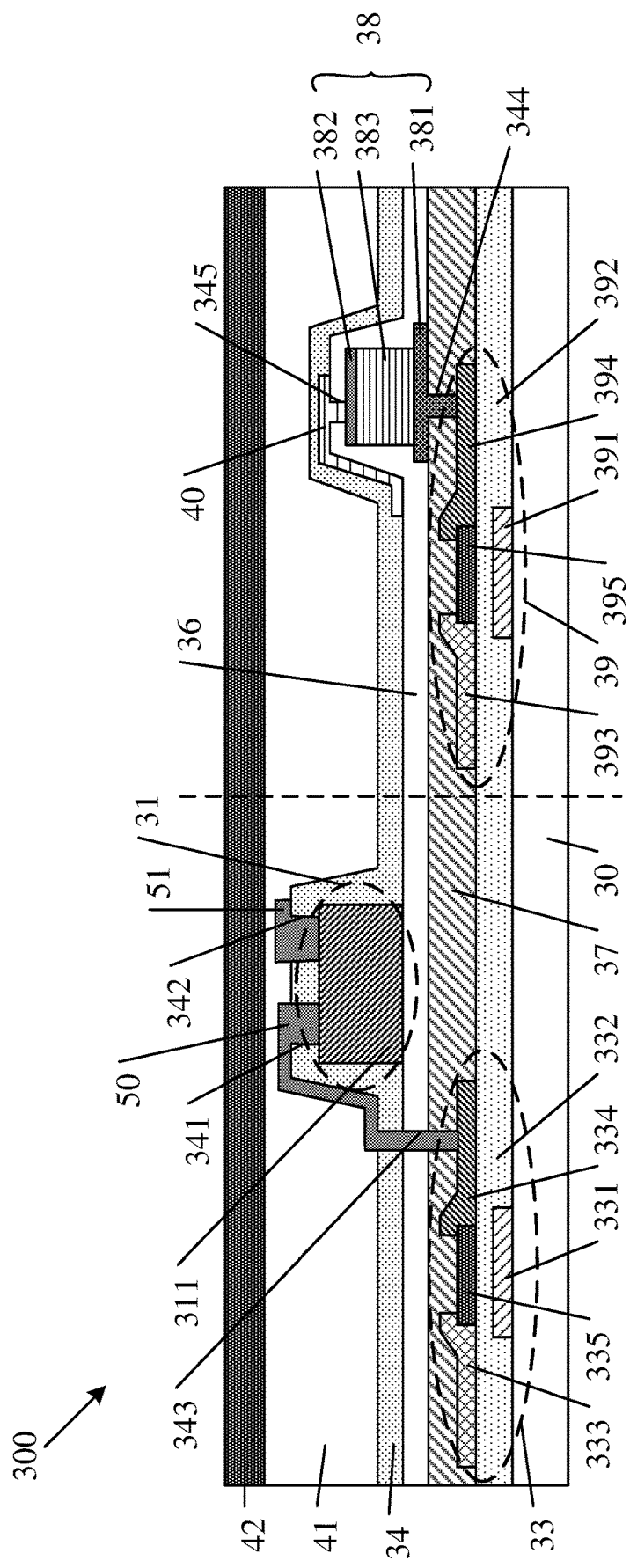
FIG. 2B is a cross-sectional structural schematic diagram of another microfluidic substrate provided by some embodiments of the present disclosure.
Figure 3B:
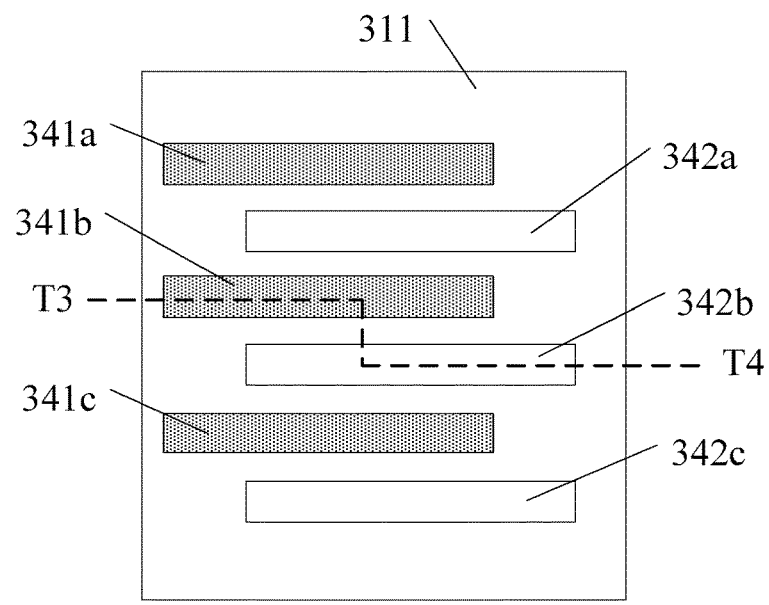
FIG. 3B is a plane structural schematic diagram of another acoustic wave generation device provided by some embodiments of the present disclosure.
Figure 4B:
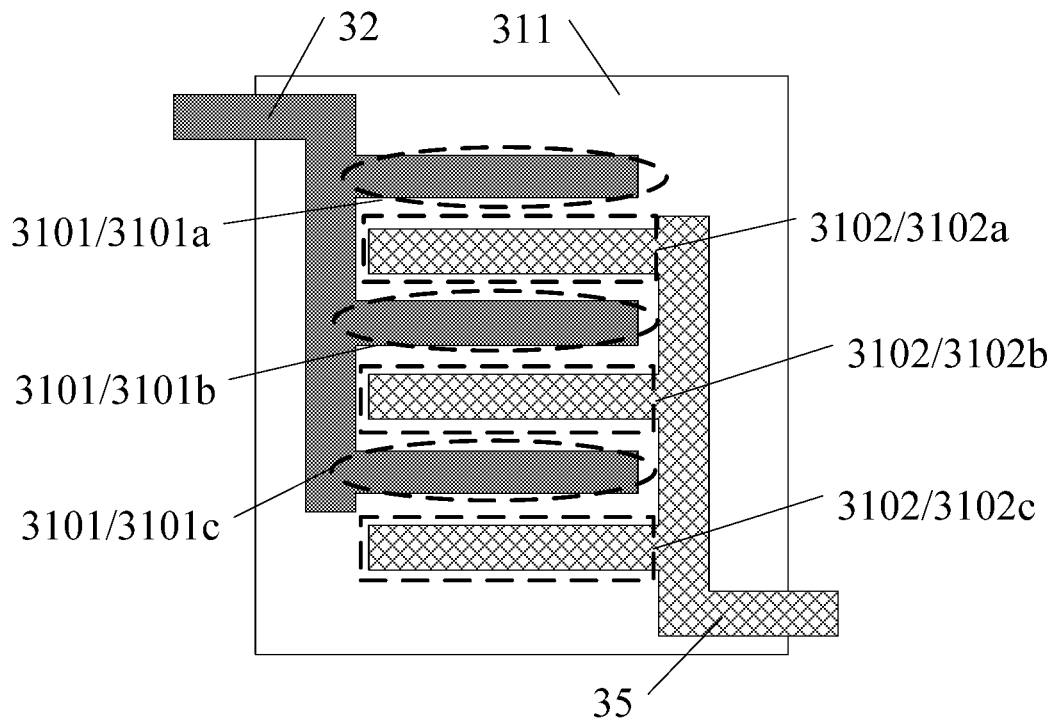
FIG. 4B is a plane structural schematic diagram of another acoustic wave generation device, another first connection electrode, and another second connection electrode provided by some embodiments of the present disclosure.

FIG. 2B is a cross-sectional structural schematic diagram of another microfluidic substrate provided by some embodiments of the present disclosure, FIG. 3B is a plane structural schematic diagram of another acoustic wave generation device provided by some embodiments of the present disclosure, and FIG. 4B is a plane schematic diagram of another acoustic wave generation device, another first connection electrode, and another second connection electrode provided by some embodiments of the present disclosure.

For example, as shown in FIG. 2B, in other embodiments, the microfluidic substrate 300 includes a base substrate 30 and an acoustic wave generation device 31. The acoustic wave generation device 31 is on the base substrate 30 and is configured to emit the acoustic wave to drive the liquid droplet to move over the microfluidic substrate 300.

For example, as shown in FIG. 2B, the microfluidic substrate 300 further includes a first composite electrode 50, a first switching element 33, and a first protective layer 34, which are on the base substrate 30. The acoustic wave generation device 31 may include an acoustic wave driving electrode and an acoustic wave generation layer 311. As shown in FIG. 4B, the acoustic wave driving electrode includes at least one first sub-electrode 3101.

For example, as shown in FIGS. 3B and 4B, the first protective layer 34 is located on a side of the acoustic wave generation layer 311 away from the base substrate 30 and includes at least one first groove 341. The first composite electrode 50 is located on a side of the first protective layer 34 away from the acoustic wave generation layer 311 in the acoustic wave generation device 31 and covers the at least one first groove 341. A portion of the first composite electrode 50 located in the at least one first groove 341 is the at least one first sub-electrode 3101, for example, the at least one first groove 341 is in one-to-one correspondence to the at least one first sub-electrode 3101, and a portion of the first composite electrode 50 located outside the at least one first groove 341 is the first connection electrode 32. That is, in fact, the at least one first groove 341 exposes a portion of the acoustic wave generation layer 311, and the first connection electrode 32 is integrally formed with the at least one first sub-electrode 3101, that is, the first connection electrode 32 and the at least one first sub-electrode 3101 are integrally formed as the first composite electrode 50. The portion circled by an oval dashed line in FIG. 4B is the first sub-electrode 3101. FIG. 4B shows three first sub-electrodes 3101, and the three first sub-electrodes 3101 are respectively a first sub-electrode 3101a, a first sub-electrode 3101b, and a first sub-electrode 3101c.

For example, the first switching element 33 is electrically connected to the first connection electrode 32. For example, the first connection electrode 32 is in direct contact with the first switching element 33 to achieve electrical connection.

For example, as shown in FIGS. 2B, 3B and 4B, the microfluidic substrate 300 further includes a second composite electrode 51. The acoustic wave driving electrode further includes at least one second sub-electrode 3102, and the first protective layer 34 further includes at least one second groove 342. The second composite electrode 51 is located on a side of the first protective layer 34 away from the acoustic wave generation layer 311 in the acoustic wave generation device 31 and covers the at least one second groove 342. A portion of the second composite electrode 51 located in the at least one second groove 342 is the at least one second sub-electrode 3102, for example, the at least one second groove 342 is in one-to-one correspondence to the at least one second sub-electrode 3102, and a portion of the second composite electrode 51 located outside the at least one second groove 342 is the second connection electrode 35. That is, in fact, the at least one second groove 342 also exposes a portion of the acoustic wave generation layer 311, and the second connection electrode 35 is integrally formed with the at least one second sub-electrode 3102, that is, the second connection electrode 35 and the at least one second sub-electrode 3102 are integrally formed as the second composite electrode 51. The second connection electrode 35 is configured to receive the common voltage signal. A portion circled by a rectangular dashed line in FIG. 4B is the second sub-electrode 3102. FIG. 4B shows three second sub-electrodes 3102, and the three second sub-electrodes 3102 are a second sub-electrode 3102a, a second sub-electrode 3102b, and a second sub-electrode 3102c, respectively.

For example, as shown in FIGS. 3B and 4B, the first protective layer 34 includes a plurality of first grooves 341 and a plurality of second grooves 342, the plurality of first grooves 341 and the plurality of second grooves 342 are alternately arranged, and the plurality of first grooves 341 and the plurality of second grooves 342 are parallel to each other. In the example as shown in FIG. 3B, the first protective layer 34 includes three first grooves 341 and three second grooves 342, the three first grooves 341 are a first groove 341a, a first groove 341b, and a first groove 341c, respectively, and the three second grooves 342 are a second groove 342a, a second groove 342b, and a second groove 342c, respectively. The second groove 342a is located between the first groove 341a and the first groove 341b, the first groove 341b is located between the second groove 342a and the second groove 342b, the second groove 342b is located between the first groove 341b and the first groove 341c, and the first groove 341c is located between the second groove 342b and the second groove 342c. In other words, there is only one second groove between any two first grooves, and correspondingly, there is only one first groove between any two second grooves.

For example, the shapes and sizes of the plurality of first grooves 341 are all the same, and the shapes and sizes of the plurality of second grooves 342 are all the same. The shape of the first groove 341 is the same as the shape of the second groove 342, the size of the first groove 341 is the same as the size of the second groove 342. For example, the first groove 341 and the second groove 342 may both be strip-shaped grooves. For example, the shape of the first groove 341 may be a long strip shape. For example, as shown in FIG. 3B, the shape of each first groove 341 is rectangular, and the shape of each second groove 342 is also rectangular. However, the present disclosure is not limited thereto, and the shapes of the first groove 341 and the second groove 342 may be zigzag, wavy, or the like.

It should be noted that in the cross-sectional structural diagram in FIG. 2B, the acoustic wave generation device and the first protective layer corresponding to the acoustic wave generation device are the cross-sectional diagram obtained according to a dashed line T3-T4 in FIG. 3B.

The specific structure of the microfluidic substrate provided by some embodiments of the present disclosure will be described in detail below with an example shown in FIG. 2A.

For example, as shown in FIG. 2A, the first switching element 13 includes a thin film transistor, the thin film transistor may include a first gate electrode 131, a first gate insulating layer 132, a first source-drain electrode 133, a second source-drain electrode 134, and a first active layer 135. The first gate electrode 131 is located on the base substrate 10. The first gate insulating layer 132 is located on the first gate electrode 131 and on a side of the first gate electrode 131 away from the base substrate 10. For example, the first gate insulating layer 132 may cover the entire base substrate 10. The first active layer 135 is located on the first gate insulating layer 132 and on a side of the first gate insulating layer 132 away from the first gate electrode 131. The first source-drain electrode 133 is located on the first gate insulating layer 132 and is electrically connected to the first active layer 135. The second source-drain electrode 134 is located on the first gate insulating layer 132 and is electrically connected to the first active layer 135. For example, as shown in FIG. 2A, the first source-drain electrode 133 and the second source-drain electrode 134 are both located on the side of the first gate insulating layer 132 away from the first gate electrode 131, and both the first source-drain electrode 133 and the second source-drain electrode 134 are electrically connected to the first active layer 135 by a lapping mode.

For example, the first source-drain electrode 133 is configured to receive the acoustic wave driving signal, and the acoustic wave driving signal is transmitted to the first sub-electrode 1101 of the acoustic wave driving electrode via the first switching element 13 and the first connection electrode 12.

For example, as shown in FIG. 2A, the microfluidic substrate 100 further includes a second protective layer 16, the second protective layer 16 is an insulating layer, such as an inorganic insulating layer or an organic insulating layer. The second protective layer 16 is located on the first switching element 13, the acoustic wave generation device 11 is located on the second protective layer 16, and in a direction perpendicular to the base substrate 10, the acoustic wave generation device 11 is located on a side of the second protective layer 16 away from the first switching element 13. The first protective layer 14 also covers a portion of the second protective layer 16. For example, the second protective layer 16 includes an exposed portion that is not blocked by the acoustic wave generation device 11, and the first protective layer 14 covers the exposed portion of the second protective layer 16.

For example, as shown in FIG. 2A, the microfluidic substrate 100 further includes a passivation layer 17, the passivation layer 17 is an insulating layer, such as an inorganic insulating layer or an organic insulating layer, and the passivation layer 17 is disposed between the first switching element 13 and the second protective layer 16, that is, in a direction perpendicular to the base substrate 10, the passivation layer 17 is located on the first switching element 13, the second protective layer 16 is located on the passivation layer 17, and is located on a side of the passivation layer 17 away from the first switching element 13. For example, the passivation layer 17 may also function as a planarization layer, and provides a flat surface for forming the acoustic wave generation device, the signal detection device, etc. For example, the passivation layer 17 is in direct contact with the first gate insulating layer 132, the first source-drain electrode 133, the second source-drain electrode 134, and the first active layer 135 of the first switching element 13, while the second protective layer 16 is in direct contact with the passivation layer 17.

For example, as shown in FIG. 2A, the microfluidic substrate 100 further includes a third via hole 143. The third via hole 143 penetrates through the passivation layer 17, the second protective layer 16, and the first protective layer 14, and exposes a portion of the first switching element 13. The first connection electrode 12 is electrically connected to the first switching element 13 through the third via hole 143. For example, the third via hole 143 exposes a portion of the second source-drain electrode 134 in the first switching element 13, and the first connection electrode 12 is electrically connected to the second source-drain electrode 134 through the third via hole 143. For example, the first connection electrode 12 is in direct contact with the second source-drain electrode 134 through the third via hole 143 to achieve electrical connection.

For example, as shown in FIG. 2A, the microfluidic substrate 100 further includes a signal detection device 18 and a second switching element 19, which are disposed on the base substrate 10. The signal detection device 18 is electrically connected to the second switching element 19. The first protective layer 14 also covers the signal detection device 18 and the second switching element 19.

It should be noted that in the present disclosure, the first protective layer 14, the second protective layer 16, and the passivation layer 17 are formed on the entire base substrate 10, whereby, for example, as shown in FIG. 2A, the first protective layer 14, the second protective layer 16, and the passivation layer 17 may cover the first switching element 13 and the second switching element 19, and the first protective layer 14 may also cover the acoustic wave generation device 11 and the signal detection device 18.

For example, the signal detection device 18 may include a photodiode (e.g., PIN photodiode, etc.), a phototransistor, etc. The signal detection device 18 includes a semiconductor stack layer 183, a first driving electrode 181, and a second driving electrode 182. For example, in the case where the signal detection device 18 is a PIN photodiode, the semiconductor stack layer 183 may include a P-type semiconductor layer, an N-type semiconductor layer, and an intrinsic semiconductor layer, and the intrinsic semiconductor layer is located between the P-type semiconductor layer and the N-type semiconductor layer. The passivation layer 17 also covers the second switching element 19. In the direction perpendicular to the base substrate 10, the first driving electrode 181 is located on a side of the passivation layer 17 away from the second switching element 19, the semiconductor stack layer 183 is located on a side of the first driving electrode 181 away from the passivation layer 17, and the second driving electrode 182 is located on a side of the semiconductor stack layer 183 away from the first driving electrode 181.

For example, an orthographic projection of the semiconductor stack layer 183 on the base substrate 10 is located within an orthographic projection of the first driving electrode 181 on the base substrate 10.

For example, the first driving electrode 181 and the second driving electrode 182 may be prepared of the same conductive material.

For example, the second switching element 19 may also include a thin film transistor, the thin film transistor includes a second gate electrode 191, a second gate insulating layer 192, a third source-drain electrode 193, a fourth source-drain electrode 194, and a second active layer 195. The second gate electrode 191 is located on the base substrate 10. In the direction perpendicular to the base substrate 10, the second gate insulating layer 192 is located on the second gate electrode 191 and on a side of the second gate electrode 191 away from the base substrate 10; the second active layer 195 is located on the second gate insulating layer 192 and on a side of the second gate insulating layer 192 away from the second gate electrode 191. The third source-drain electrode 193 is located on the second gate insulating layer 192 and is electrically connected to the first active layer 195. The fourth source-drain electrode 194 is located on the second gate insulating layer 192 and is electrically connected to the first active layer 195. The third source-drain electrode 193 and the fourth source-drain electrode 194 are both located on a side of the second gate insulating layer 192 away from the second gate electrode 191.

For example, a respective layer in the first switching element 13 and a corresponding layer in the second switching element 19 may be formed by the same conductive film through one patterning process. For example, the first gate electrode 131 and the second gate electrode 191 may be simultaneously formed by the same conductive film through one patterning process, and the first active layer 135 and the second active layer 195 may be simultaneously formed by the same conductive film through one patterning process. The first source-drain electrode 133, the second source-drain electrode 134, the third source-drain electrode 193, and the fourth source-drain electrode 194 may be simultaneously formed by the same conductive film through one patterning process. The first gate insulating layer 132 and the second gate insulating layer 192 are integrally provided, that is, the first gate insulating layer 132 and the second gate insulating layer 192 may be two portions, which are located in different regions of the base substrate 10, of the same gate insulating layer.

It should be noted that in the embodiment of the present disclosure, the patterning process is, for example, a photolithographic patterning process, which includes, for example, coating a photoresist film on a structural layer to be patterned, the method for coating the photoresist film being a spin coating method, a knife coating method, or a roll coating method; then using a mask plate to expose the photoresist layer, and developing the exposed photoresist layer to obtain a photoresist pattern; then etching the structural layer by the photoresist pattern; and finally, stripping the photoresist to form a desired pattern structure. The one patterning process may include using the same mask plate to perform one or more exposures and etching processes.

For example, as shown in FIG. 2A, the passivation layer 17 includes a fourth via hole 144, the first driving electrode 181 is electrically connected to the second switching element 19 through the fourth via hole 144. For example, the fourth via hole 144 exposes a portion of the fourth source-drain electrode 194, and the first driving electrode 181 is in direct contact with the fourth source-drain electrode 194 through the fourth via hole 144 to achieve electrical connection.

For example, as shown in FIG. 2A, the microfluidic substrate 100 further includes a detection signal line 20. The second protective layer 16 covers the second driving electrode 182. The second protective layer 16 includes a fifth via hole 145, and the fifth via hole 145 exposes a portion of the second driving electrode 182. The detection signal line 20 is located on the second protective layer 16. For example, the detection signal line 20 is located on a side of the second protective layer 16 away from the second driving electrode 182, and the detection signal line 20 is electrically connected to the second driving electrode 182 through the fifth via hole 145.

For example, in the case where the second switching element 19 is turned on, the electrical signal on the first driving electrode 181 of the signal detection device 18 can be transmitted to the electrical signal detection unit via the second switching element 19, and the electrical signal detection unit can detect the property of the sample in the liquid droplet by detecting the electrical signal on the first driving electrode 181. The detection signal line 20 is configured to provide a detection driving signal to the second driving electrode 182. For example, in the detection process, the liquid droplet is located above the signal detection device 18, the detection signal line 20 provides the detection driving signal to the second driving electrode 182, and the signal detection device 18 detects the liquid droplet under control of the detection driving signal. In this case, the second switching element 19 is turned on, so that the electrical signal on the first driving electrode 181 can be transmitted to the electrical signal detection unit via the second switching element 19. Based on different detection principles, the detection of the sample in the liquid droplet may include optical detection (e.g., including fluorescence detection, absorbance detection, and chemiluminescence detection, etc.), electrochemical detection (e.g., including current detection, impedance detection, etc.), and magnetoresistance detection, etc. The optical detection is to determine various indexes of the sample by detecting various parameters of light; the electrochemical detection is to obtain the content of the sample or to characterize certain electrochemical properties of the sample by detecting the electrical response of the sample, for example, by measuring changes in current flowing through the sample or changes in impedance generated by the sample. It should be noted that in the process of the optical detection of the liquid droplet, external ambient light or a separately provided external light source can be used as a light source to achieve the optical detection of the liquid droplet.

For example, the detection signal line 20 and the acoustic wave driving electrode are disposed on the same layer and prepared of the same material. In the embodiment of the present disclosure, "disposed on the same layer" means that two components are formed by the same conductive film through one patterning process. Therefore, the formation of the acoustic wave driving electrode on the acoustic wave generation layer 111 is achieved without adding a mask plate.

For example, the base substrate 10 may be a glass substrate, a quartz substrate, a silicon substrate, or the like.

For example, in a direction parallel to the surface of the base substrate 10, the acoustic wave generation device 11 and the signal detection device 18 are spaced apart, that is, an orthographic projection of the acoustic wave generation device 11 on the base substrate 10 and an orthographic projection of the signal detection device 18 on the base substrate 10 do not overlap, so as to avoid the influence of the acoustic wave generation device 11 on the detecting of the liquid droplet. In the direction perpendicular to the base substrate 10, the orthographic projection of the acoustic wave generation device 11 on the base substrate 10 and the orthographic projection of the first switching element 13 on the base substrate 10 may also not overlap.

For example, as shown in FIG. 2A, the microfluidic substrate 100 may further include a flat layer 21 and a hydrophobic layer 22. The flat layer 21 covers the first protective layer 14, the first connection electrode 12, and the second connection electrode, and the hydrophobic layer 22 is located on the flat layer 21 and on a side of the flat layer 21 away from the first protective layer 14.

For example, as shown in FIG. 2B, the microfluidic substrate 300 further includes a signal detection device 38 and a second switching element 39, which are on the base substrate 30. The signal detection device 38 is electrically connected to the second switching element 39. The signal detection device 38 includes a semiconductor stack layer 383, a first driving electrode 381, and a second driving electrode 382. The first switching element 33 may include a first gate electrode 331, a first gate insulating layer 332, a first source-drain electrode 333, a second source-drain electrode 334, and a first active layer 335. The second switching element 39 may include a second gate electrode 391, a second gate insulating layer 392, a third source-drain electrode 393, a fourth source-drain electrode 194, and a second active layer 395.

For example, as shown in FIG. 2B, the microfluidic substrate 300 further includes a second protective layer 36 and a passivation layer 37. The passivation layer 37 is located on the first switching element 33 and the second switching element 39, and the second protective layer 36 is located on the passivation layer 37 and on a side of the passivation layer 37 away from the first switching element 33 and the second switching element 39.

For example, the microfluidic substrate 300 further includes a third via hole 343. The third via hole 343 penetrates through the passivation layer 37, the second protective layer 36, and the first protective layer 34, and exposes a portion of the first switching element 33, and the first connection electrode is electrically connected to the first switching element 33 through the third via hole 343. For example, the third via hole 343 exposes a portion of the second source-drain electrode 334 of the first switching element 33, and the first connection electrode is in direct contact with the second source-drain electrode 334 of the first switching element 33 through the third via hole 343 to achieve electrical connection. The passivation layer 37 includes a fourth via hole 344 that exposes a portion of the fourth source-drain electrode 394 of the second switching element 39, and the first driving electrode 381 is in direct contact with the fourth source-drain electrode 394 of the second switching element 39 through the fourth via hole 344 to achieve electrical connection.

For example, as shown in FIG. 2B, the microfluidic substrate 300 further includes a detection signal line 40. The second protective layer 36 covers the second driving electrode 382. The second protective layer 36 includes a fifth via hole 345 that exposes a portion of the second driving electrode 382. The detection signal line 40 is located on the second protective layer 36 and is electrically connected to the second driving electrode 382 through the fifth via hole 345.

For example, in the embodiment as shown in FIG. 2B, the detection signal line 40 may be located on a side of the second protective layer 36 away from the base substrate 30, the fifth via hole 345 penetrates through the second protective layer 36 and exposes a portion of the second driving electrode 382, and the detection signal line 40 is electrically connected to the second driving electrode 382 through the fifth via hole 345. It should be noted that in other embodiments, in the case where the detection signal line 40 and the acoustic wave driving electrode are disposed on the same layer, the detection signal line 40 may be located on a side of the first protective layer 34 away from the base substrate 30. In this case, the fifth via hole 345 penetrates through the first protective layer 34 and the second protective layer 36 and exposes a portion of the second driving electrode 382, and the detection signal line 40 is electrically connected to the second driving electrode 382 through the fifth via hole 345.

For example, as shown in FIG. 2B, the microfluidic substrate 300 may further include a flat layer 41 and a hydrophobic layer 42. The flat layer 41 covers the first protective layer 34, the first connection electrode 32, and the second connection electrode 35, and the hydrophobic layer 42 is located on the flat layer 41 and on a side of the flat layer 41 away from the first protective layer 34.

It should be noted that the above description of the example as shown in FIG. 2A is applicable to the example as shown in FIG. 2B under the condition of no contradiction, and the repetition will not be repeated here.

Figure 7:
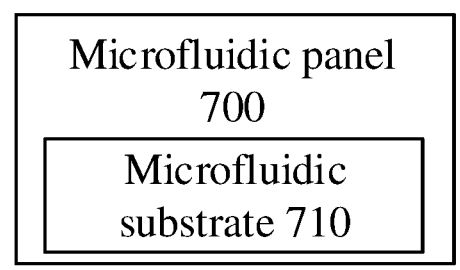
FIG. 7 is a schematic block diagram of a microfluidic panel provided by some embodiments of the present disclosure.
Figure 8:
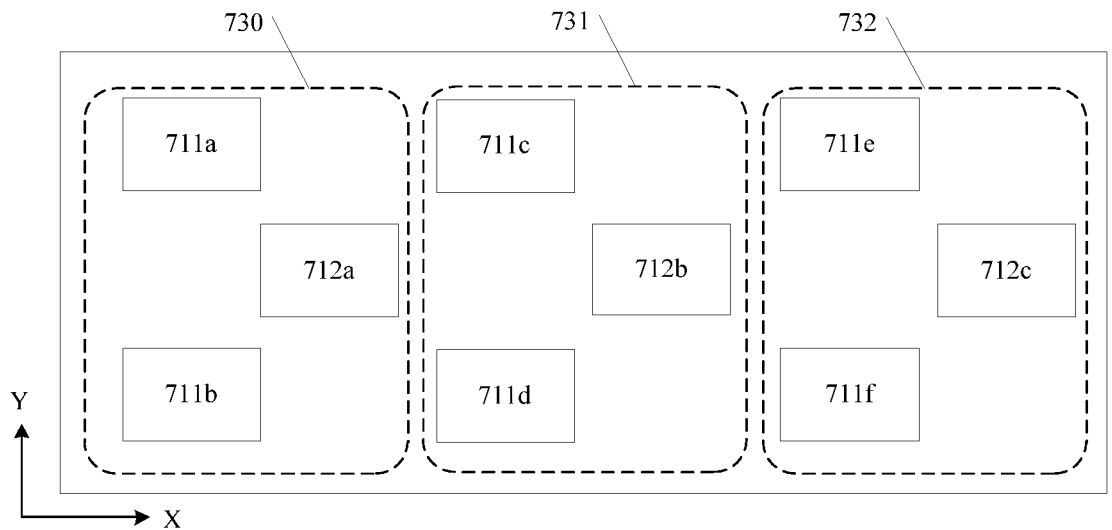
FIG. 8 is a plane schematic diagram of a microfluidic panel provided by some embodiments of the present disclosure.

Some embodiments of the present disclosure also provide a microfluidic panel, FIG. 7 is a schematic block diagram of a microfluidic panel provided by some embodiments of the present disclosure, and FIG. 8 is a plane schematic diagram of a microfluidic panel provided by some embodiments of the present disclosure.

For example, as shown in FIG. 7, the microfluidic panel 700 includes the microfluidic substrate 710 according to any one of the above embodiments, and may further include a controller and a signal processing circuit (not shown). The controller is coupled with the acoustic wave generation device in the microfluidic substrate 710 to control the acoustic wave generation device to emit the acoustic wave as required. For example, the controller can generate acoustic wave driving signals and common voltage signals, and transmit the acoustic wave driving signals and the common voltage signals to the microfluidic substrate 710 and finally to the acoustic wave generation device; and the signal processing circuit is coupled with a signal detection device in the microfluidic substrate 710 to control the signal detection device to perform detection and process on the detection signals obtained by the signal detection device.

For example, in some embodiments, as shown in FIG. 8, the microfluidic substrate 710 includes a plurality of acoustic wave generation devices and a plurality of signal detection devices, and the plurality of acoustic wave generation devices surround the plurality of signal detection devices. The plurality of acoustic wave generation devices can generate a plurality of acoustic waves, and the plurality of acoustic waves are superimposed on the liquid droplets to generate driving forces in any direction, so as to control the liquid droplets to move freely over a surface of the microfluidic panel 700.

For example, each signal detection device may detect a property of a sample in a liquid droplet. A plurality of signal detection devices can respectively detect different properties of the same sample. A plurality of signal detection devices can respectively detect the same property of different samples, or a plurality of signal detection devices can respectively detect different properties of different samples. This present disclosure is not limited thereto.

It should be noted that the specific arrangement of the acoustic wave generation device and the signal detection device can be designed according to the actual situation, as long as it is ensured that the acoustic wave generation device can synthesize the driving force in the predetermined direction to drive the liquid droplet to move in the predetermined direction.

For example, in some examples, a plurality of acoustic wave generation devices and a plurality of signal detection devices constitute a plurality of repeating units, each repeating unit includes two acoustic wave generation devices and one signal detection device, the two acoustic wave generation devices and the signal detection device are arranged along a first direction Y, and the signal detection device is located between the two acoustic wave generation devices. The plurality of repeating units are arranged along a second direction X to form a plurality of repeating unit groups, and the plurality of repeating unit groups are arranged along the first direction Y, whereby the plurality of repeating units can be arranged in an array along the first direction Y and the second direction X. The first direction Y and the second direction Y are not parallel, for example, the first direction Y and the second direction X are perpendicular.

For example, as shown in FIG. 8, in an example, the microfluidic substrate 710 includes six acoustic wave generation devices, namely, a first acoustic wave generation device 711*a*, a second acoustic wave generation device 711*b*, a third acoustic wave generation device 711*c*, a fourth acoustic wave generation device 711*d*, a fifth acoustic wave generation device 711*e*, and a sixth acoustic wave generation device 711*f*. The microfluidic substrate 710 includes three signal detection devices, namely a first signal detection device 712*a*, a second signal detection device 712*b*, and a third signal detection device 712*c*. The first acoustic wave generation device 711*a*, the second acoustic wave generation device 711*b*, and the first signal detection device 712*a* constitute a first repeating unit 730, the third acoustic wave generation device 711*c*, the fourth acoustic wave generation device 711*d*, and the second signal detection device 712*b* constitute a second repeating unit 731, and the fifth acoustic wave generation device 711*e*, the sixth acoustic wave generation device 711*f*, and the third signal detection device 712*c* constitute a third repeating unit 732. The first repeating unit 730, the second repeating unit 731, and the third repeating unit 732 are arranged along the second direction X.

It should be noted that the description of the acoustic wave generation device 711, the signal detection device 712, and other related structures in the microfluidic substrate 710 can refer to the detailed description of the acoustic wave generation device, the signal detection device, and other corresponding structures in the embodiments of the microfluidic substrate described above, and repetition will not be repeated again. The microfluidic panel 700 and a cover plate disposed opposite to the microfluidic panel 700 may constitute a microfluidic device, and the cover plate may be disposed on a side of the hydrophobic layer in the microfluidic substrate away from the base substrate.

Figure 9:
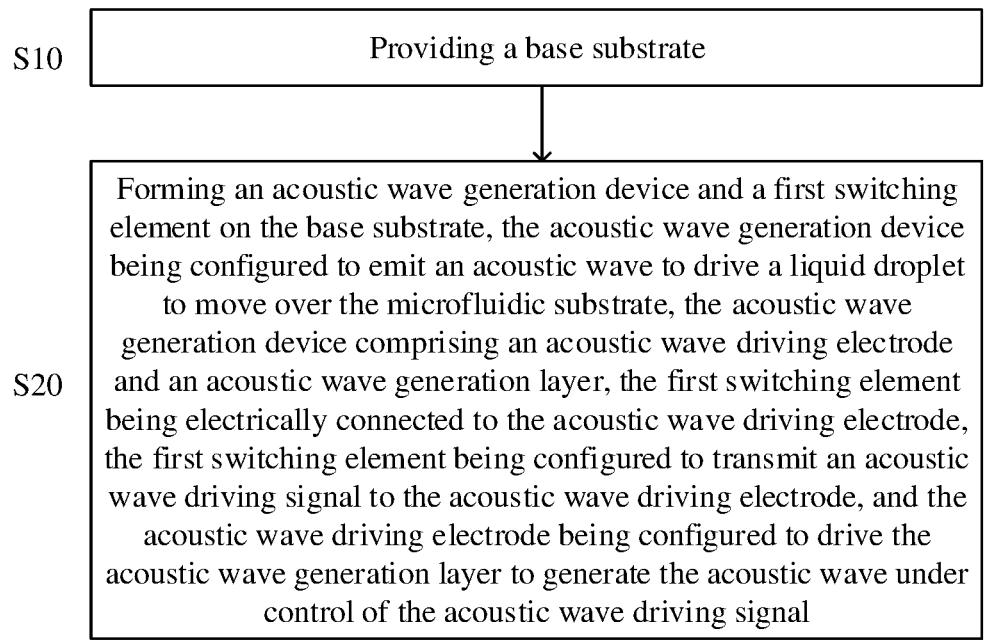
FIG. 9 is a flowchart of a manufacture method for manufacturing a microfluidic substrate provided by some embodiments of the present disclosure.
Figure 10:
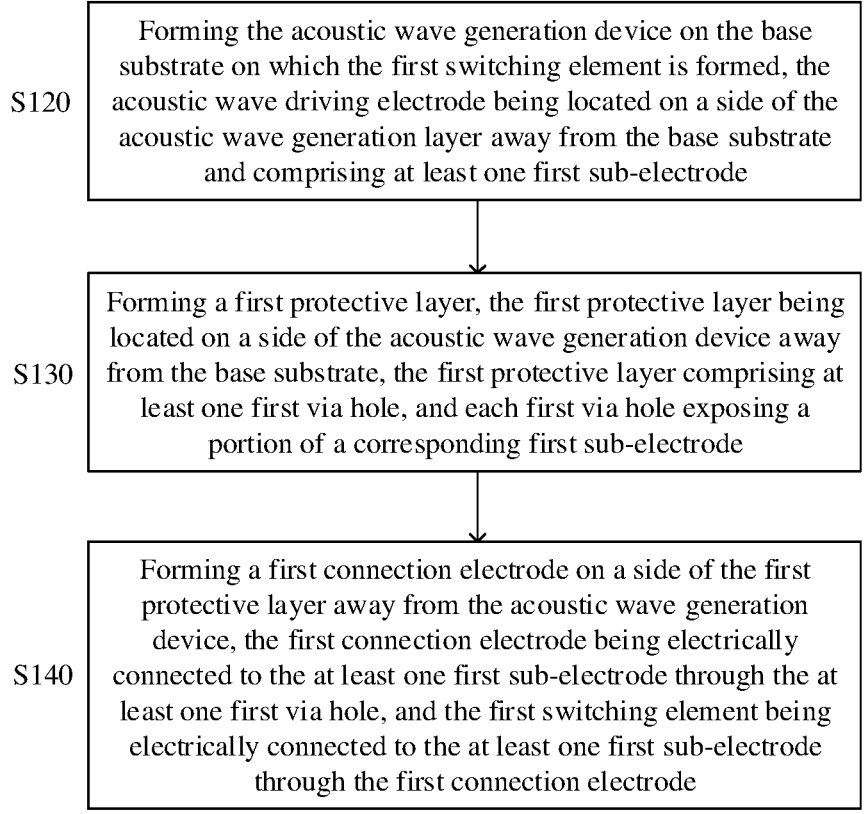
FIG. 10 is a flowchart of a manufacture method for manufacturing a microfluidic substrate provided by some examples of some embodiments of the present disclosure.
Figure 11:
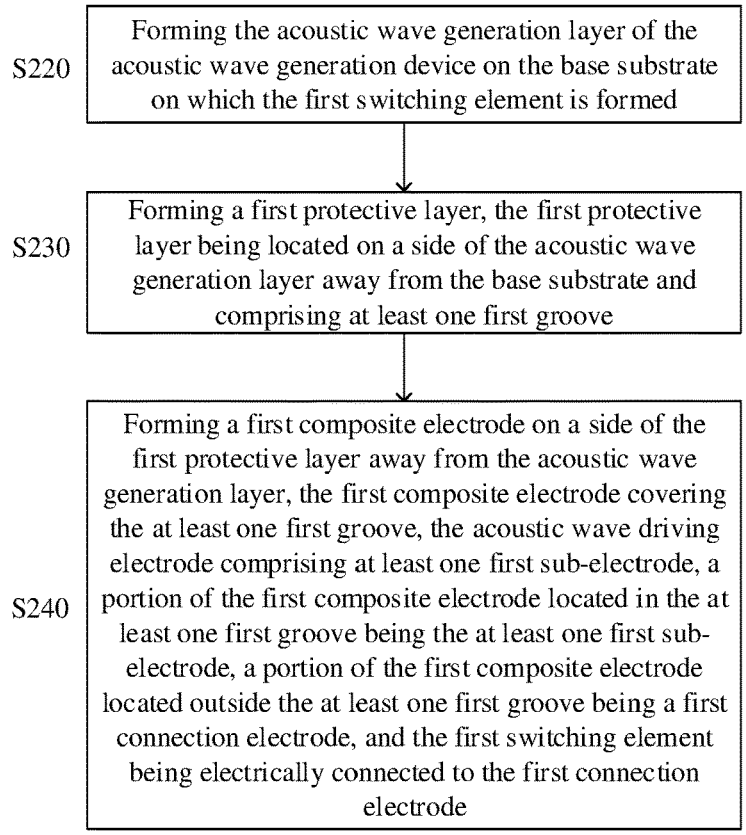
FIG. 11 is a flowchart of a manufacture method for manufacturing a microfluidic substrate provided by other examples of some embodiments of the present disclosure.

Some embodiments of the present disclosure also provide a manufacture method for manufacturing the microfluidic substrate, and the manufacture method can be used to manufacture the microfluidic substrate provided by any one of the above embodiments. FIG. 9 is a flowchart of a manufacture method for manufacturing a microfluidic substrate provided by some embodiments of the present disclosure, FIG. 10 is a flowchart of a manufacture method for manufacturing a microfluidic substrate provided by some examples of some embodiments of the present disclosure, FIG. 11 is a flowchart of a manufacture method for manufacturing a microfluidic substrate provided by other examples of some embodiments of the present disclosure, and FIGS. 12A-12J are process flowcharts of the manufacture method for manufacturing the microfluidic substrate as shown in FIG. 10.

For example, as shown in FIG. 9, the manufacture method for manufacturing the microfluidic substrate includes:

S10: providing a base substrate;

S20: forming an acoustic wave generation device and a first switching element on the base substrate, the acoustic wave generation device being configured to emit an acoustic wave to drive a liquid droplet to move over the microfluidic substrate, the acoustic wave generation device comprising an acoustic wave driving electrode and an acoustic wave generation layer, the first switching element being electrically connected to the acoustic wave driving electrode, the first switching element being configured to transmit an acoustic wave driving signal to the acoustic wave driving electrode, and the acoustic wave driving electrode being configured to drive the acoustic wave generation layer to generate the acoustic wave under control of the acoustic wave driving signal.

For example, in some examples, as shown in FIG. 10, the manufacture method for manufacturing the microfluidic substrate may include:

S120: forming the acoustic wave generation device on the base substrate on which the first switching element is formed, the acoustic wave driving electrode being located on a side of the acoustic wave generation layer away from the base substrate and comprising at least one first sub-electrode;

S130: forming a first protective layer, the first protective layer being located on a side of the acoustic wave generation device away from the base substrate, the first protective layer comprising at least one first via hole, and each first via hole exposing a portion of a corresponding first sub-electrode;

S140: forming a first connection electrode on a side of the first protective layer away from the acoustic wave generation device, the first connection electrode being electrically connected to the at least one first sub-electrode through the at least one first via hole, and the first switching element being electrically connected to the at least one first sub-electrode through the first connection electrode.

For example, in step S20, forming the first switching element includes: forming a first gate electrode on the base substrate; forming a first gate insulating layer on the first gate electrode, the first gate insulating layer being formed on a side of the first gate electrode away from the base substrate; forming a first active layer on the first gate insulating layer, the first active layer being formed on a side of the first gate insulating layer away from the first gate electrode; forming a first source-drain electrode and a second source-drain electrode on the first gate insulating layer, the first source-drain electrode and the second source-drain electrode being formed on the side of the first gate insulating layer away from the first gate electrode and are electrically connected to the first active layer.

For example, after forming the first switching element, the manufacture method may further include: forming a passivation layer on the first switching element; forming a second protective layer on the passivation layer, the second protective layer being formed on a side of the passivation layer away from the first switching element.

For example, in step S120, forming the acoustic wave generation device includes: forming an acoustic wave generation layer on the second protective layer, the acoustic wave generation layer being formed on a side of the second protective layer away from the passivation layer; and forming an acoustic wave driving electrode on a side of the acoustic wave generation layer away from the second protective layer.

For example, the acoustic wave driving electrode further includes at least one second sub-electrode, and the first protective layer further includes at least one second via hole. In step S130, forming the first protective layer includes: depositing the first protective layer on the side of the acoustic wave generation device away from the base substrate, and forming the at least one first via hole and the at least one second via hole in the first protective layer through a patterning process. For example, each second via hole exposes a portion of a corresponding second sub-electrode.

For example, the manufacture method of some embodiments of the present disclosure further includes:
S150: forming a second switching element on the base substrate;
S160: forming a signal detection device on the base substrate on which the second switching element is formed, the first protective layer also covering the signal detection device and the second switching element, and the signal detection device being electrically connected to the second switching element.

For example, in step S150, forming the second switching element includes: forming a second gate electrode on the base substrate; forming a second gate insulating layer on the second gate electrode, the second gate insulating layer being formed on a side of the second gate electrode away from the base substrate; forming a second active layer on the second gate insulating layer, the second active layer being formed on a side of the second gate insulating layer away from the second gate electrode; forming a third source-drain electrode and a fourth source-drain electrode on the second gate insulating layer, the third source drain electrode and the fourth source drain electrode being formed on the side of the second gate insulating layer away from the second gate electrode and are electrically connected with the second active layer.

For example, the passivation layer also covers the second switching element, the signal detection device is formed on the passivation layer and located on a side of the passivation layer away from the second switching element, and the second protective layer also covers the signal detection device. In step S160, forming the signal detection device includes: forming a first driving electrode on a side of the passivation layer away from the base substrate, wherein the passivation layer includes a fourth via hole, the fourth via hole exposes a portion of the fourth source-drain electrode, and the first driving electrode is electrically connected to the fourth source-drain electrode through the fourth via hole; forming a semiconductor stack layer on the first driving electrode, the semiconductor stack layer being formed on a side of the first driving electrode away from the passivation layer; and forming a second driving electrode on the semiconductor stack layer, the second driving electrode being formed on a side of the semiconductor stack layer away from the first driving electrode.

For example, the manufacture method further includes: forming a detection signal line on the base substrate. The detection signal line is electrically connected with the signal detection device. For example, the second protective layer includes a fifth via hole that exposes a portion of the second driving electrode. The detection signal line is formed on the second protective layer, and is electrically connected to the second driving electrode through the fifth via hole.

For example, the detection signal line and the acoustic wave driving electrode are on the same layer and are formed by the same conductive film through the one patterning process.

For example, in other examples, as shown in FIG. 11, the manufacture method of the microfluidic substrate includes:
S220: forming the acoustic wave generation layer of the acoustic wave generation device on the base substrate on which the first switching element is formed;
S230: forming a first protective layer, the first protective layer being located on a side of the acoustic wave generation layer away from the base substrate and comprising at least one first groove;
S240: forming a first composite electrode on a side of the first protective layer away from the acoustic wave generation layer, the first composite electrode covering the at least one first groove, the acoustic wave driving electrode comprising at least one first sub-electrode, a portion of the first composite electrode located in the at least one first groove being the at least one first sub-electrode, a portion of the first composite electrode located outside the at least one first groove being a first connection electrode, and the first switching element being electrically connected to the first connection electrode.

For example, the first protective layer further includes the at least one second groove. In step S230, forming the first protective layer includes: depositing the first protective layer on the side of the acoustic wave generation device away from the base substrate, and forming the at least one first groove and the at least one second groove in the first protective layer through the patterning process. The at least one first groove and the at least one second groove both expose the acoustic wave generation layer.

For example, in step S240, the first connection electrode and the first sub-electrode are integrally formed.

For example, step S240 further includes: forming a second composite electrode on the side of the first protective layer away from the acoustic wave generation layer. The second composite electrode covers the at least one second groove, and the acoustic wave driving electrode further comprises at least one second sub-electrode. The portion of the second composite electrode located in the at least one second groove is the at least one second sub-electrode, and the portion of the second composite electrode located outside the at least one second groove is the second connection electrode. That is, the second connection electrode and the second sub-electrode are integrally formed.

For example, the manufacture method according to some embodiments of the present disclosure further includes:

S250: forming a second switching element on the base substrate;

S260: forming a signal detection device on the base substrate on which the second switching element is formed, the first protective layer also covering the signal detection device and the second switching element, and the signal detection device being electrically connected to the second switching element.

It should be noted that the manufacture method as shown in FIG. 10 is used to manufacture the microfluidic substrate as shown in FIG. 2A, and the manufacture method as shown in FIG. 11 is used to manufacture the microfluidic substrate as shown in FIG. 2B. In the case of no conflict, the detailed description of the manufacture method as shown in FIG. 11 can refer to the description of the manufacture method as shown in FIG. 10 and will not be repeated here again.

Next, the manufacture method for manufacturing the exemplary microfluidic substrate as shown in FIG. 10 will be described in detail with reference to FIGS. 12A to 12J.

Figure 12A:
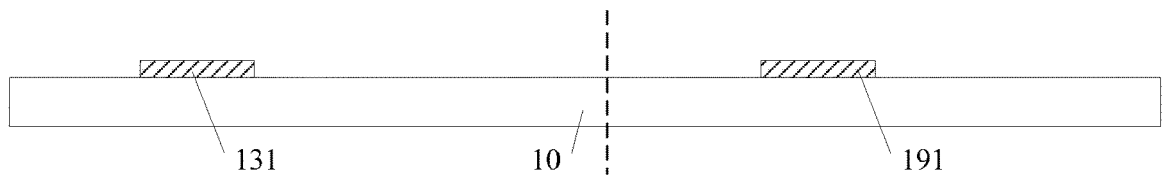
FIGS. 12A-12J are process flow diagrams of the manufacture method for manufacturing the microfluidic substrate as shown in FIG. 10.

For example, as shown in FIG. 12A, the base substrate 10 is provided, a layer of metal film is deposited on the base substrate 10, and the metal film is patterned, thereby forming the first gate electrode 131 and the second gate electrode 191 on the base substrate 10. It should be noted that while forming the first gate electrode 131 and the second gate electrode 191, two signal lines, which are electrically connected to the first gate electrode 131 and the second gate electrode 191, respectively, are formed, and the two signal lines are used to apply control signals to the first gate electrode 131 and the second gate electrode 19, respectively.

Figure 12B:
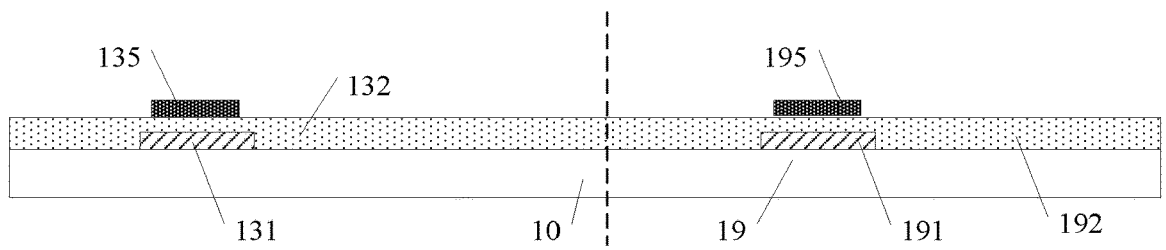

For example, as shown in FIG. 12B, an insulating layer film is deposited on the base substrate 10 on which the first gate electrode 131 and the second gate electrode 191 are formed to form the first gate insulating layer 132 and the second gate insulating layer 192. For example, the first gate insulating layer 132 and the second gate insulating layer 192 are integrated. Then, a semiconductor layer thin film is deposited on the first gate insulating layer 132 and the second gate insulating layer 192, and the first active layer 135 and the second active layer 195 are formed by one patterning process.

For example, in the direction perpendicular to the base substrate 10, the first active layer 135 and the first gate electrode 131 are at least partially overlapped, and the second active layer 195 and the second gate electrode 191 are at least partially overlapped, that is, the orthographic projection of the first active layer 135 on the base substrate 10 and the orthographic projection of the first gate electrode 131 on the base substrate 10 at least partially overlap, and the orthographic projection of the second active layer 195 on the base substrate 10 and the orthographic projection of the second gate electrode 191 on the base substrate 10 at least partially overlap.

Figure 12C:
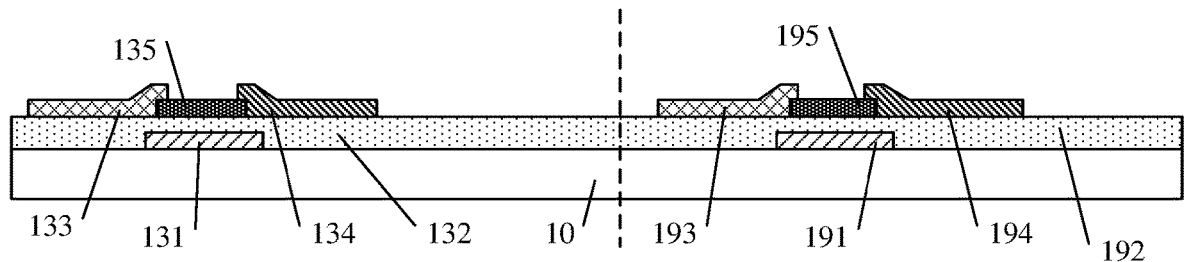

For example, as shown in FIG. 12C, a metal thin film is deposited on the base substrate 10 on which the first active layer 135 and the second active layer 195 are formed, and then the first source-drain electrode 133, the second source-drain electrode 134, the third source-drain electrode 193, and the fourth source-drain electrode 194 are formed by one patterning process.

For example, the first source-drain electrode 133 is lapped with a first end of the first active layer 135 to achieve electrical connection, and the second source-drain electrode 134 is lapped with a second end of the first active layer 135 to achieve electrical connection. Similarly, the third source-drain electrode 193 is lapped with a first end of the second active layer 195 to achieve electrical connection, and the fourth source-drain electrode 194 is lapped with a second end of the second active layer 195 to achieve electrical connection.

Figure 12D:
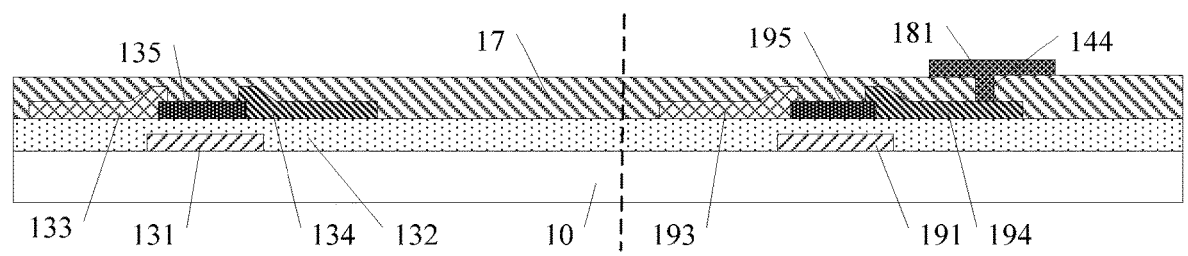

For example, as shown in FIG. 12D, an insulating layer film is deposited on the first source-drain electrode 133, the second source-drain electrode 134, the third source-drain electrode 193, and the fourth source-drain electrode 194 to form the passivation layer 17, and the fourth via hole 144 is formed in the passivation layer 17 by the patterning process. The fourth via hole 144 exposes a portion of the fourth source-drain electrode 194. Then, a metal thin film is deposited on the passivation layer 17, and the first driving electrode 181 is formed through the patterning process. The first driving electrode 181 is electrically connected to the fourth source-drain electrode 194 through the fourth via hole 144.

Figure 12E:
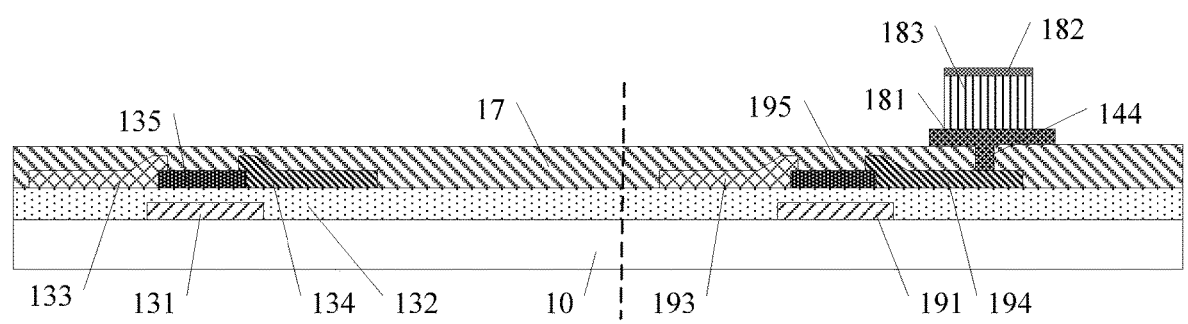

For example, as shown in FIG. 12E, the semiconductor stack layer 183 is formed on the first driving electrode 181, and a second driving electrode 182 is formed on the semiconductor stack layer 183.

Figure 12F:
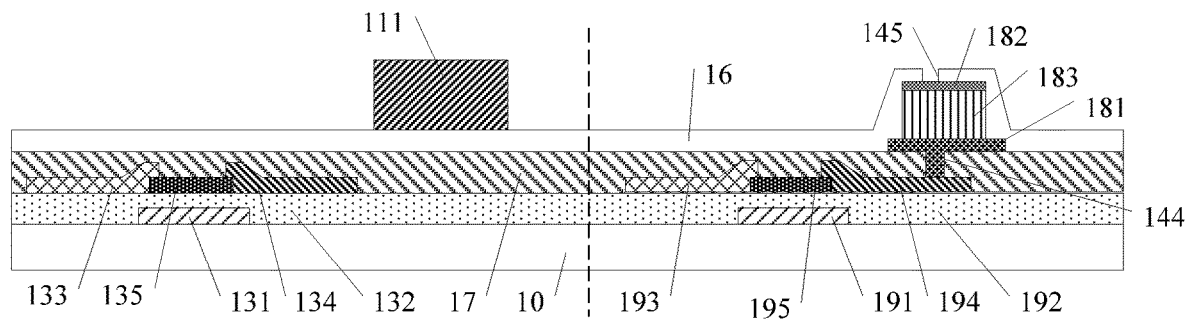

For example, as shown in FIG. 12F, an insulating layer film is deposited on the base substrate 10 on which the semiconductor stack layer 183 and the second driving electrode 182 are formed to form the second protective layer 16, and the fifth via hole 145 is formed in the second protective layer 16 by the patterning process, the fifth via hole 145 exposes a portion of the second driving electrode 182. Then, the acoustic wave generation layer 111 is formed on the second protective layer 16. The orthographic projection of the acoustic wave generation layer 111 on the base substrate 10 does not overlap with the orthographic projection of the first driving electrode 181, the orthographic projection of the semiconductor stack layer 183, and the orthographic projection of the second driving electrode 182 on the base substrate 10.

Figure 12G:
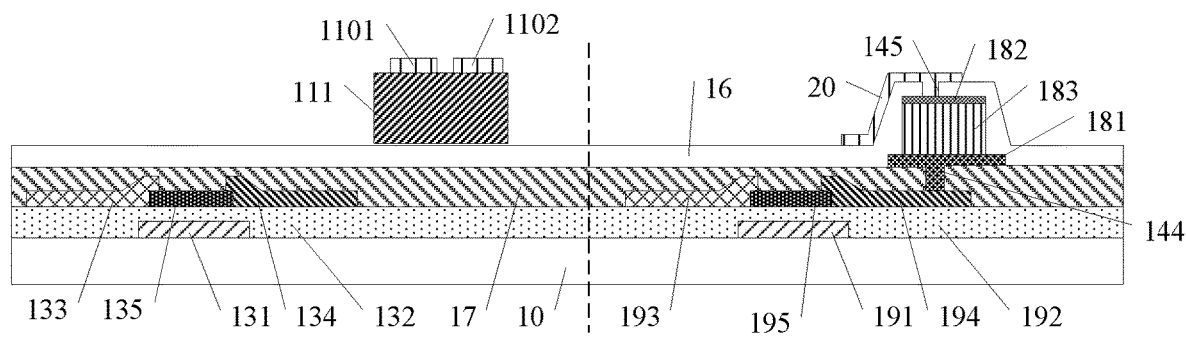

For example, as shown in FIG. 12G, a metal conductive film is deposited on the base substrate 10 on which the second protective layer 16 and the acoustic wave generation layer 111 are formed, and one patterning process is performed on the metal conductive film to form the acoustic wave driving electrode and the detection signal line 20. Therefore, the acoustic wave driving electrode can be formed on the acoustic wave generation layer 111 without adding a mask plate. As shown in FIG. 12G, the acoustic wave driving electrode may include the at least one first sub-electrode 1101 and the at least one second sub-electrode 1102. The first sub-electrode 1101 and the second sub-electrode 1102 are insulated from each other.

Figure 12H:
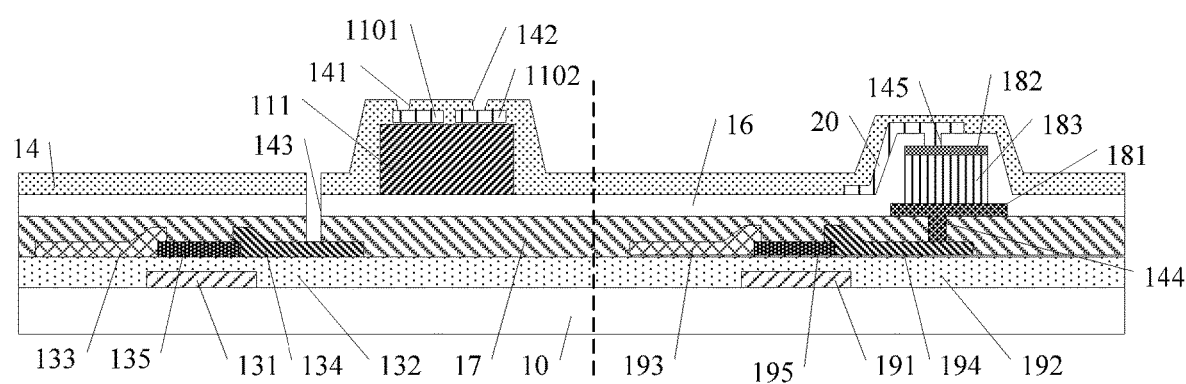

For example, as shown in FIG. 12H, an insulating layer film is deposited on the base substrate 10 on which the acoustic wave driving electrode and the detection signal line 20 are formed to form the first protective layer 14. Then, the first via hole 141, the second via hole 142, and the third via hole 143 are formed in the first protective layer 14 by the patterning process. The first via hole 141 exposes a portion of the corresponding first sub-electrode 1101 in the acoustic wave driving electrode, the second via hole 142 exposes a portion of the corresponding second sub-electrode 1102 in the acoustic wave driving electrode, and the third via hole 143 penetrates through the first protective layer 14, the second protective layer 16, and the passivation layer 17 to expose a portion of the second source-drain electrode 134.

Figure 12I:
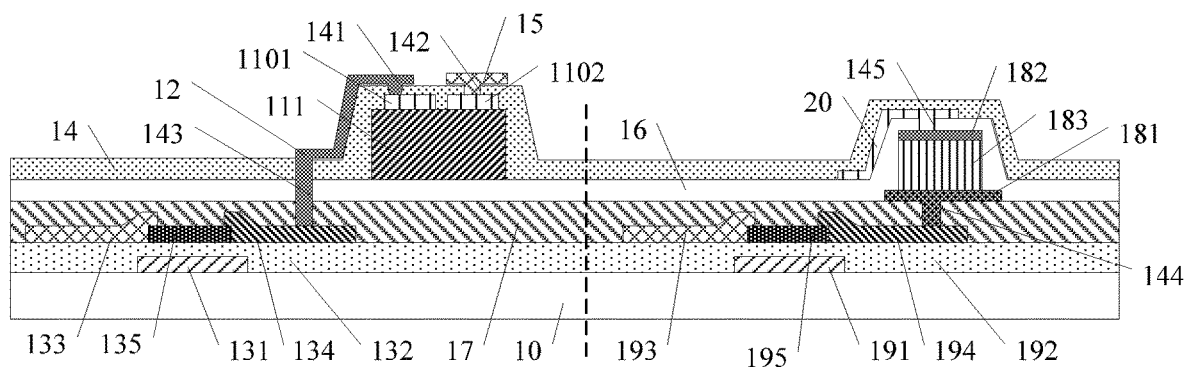

For example, as shown in FIG. 12I, a metal conductive film is deposited on the first protective layer 14, and the metal conductive film is patterned to form the first connection electrode 12 and the second connection electrode 15. The first connection electrode 12 is electrically connected to the first sub-electrode 1101 through the first via hole 141, and the first connection electrode 12 is also electrically connected to the second source-drain electrode 134 through the third via hole 143. As shown in FIG. 4A, the second connection electrode 15 is electrically connected to the second sub-electrode 1102 through the second via hole 142.

Figure 12J:
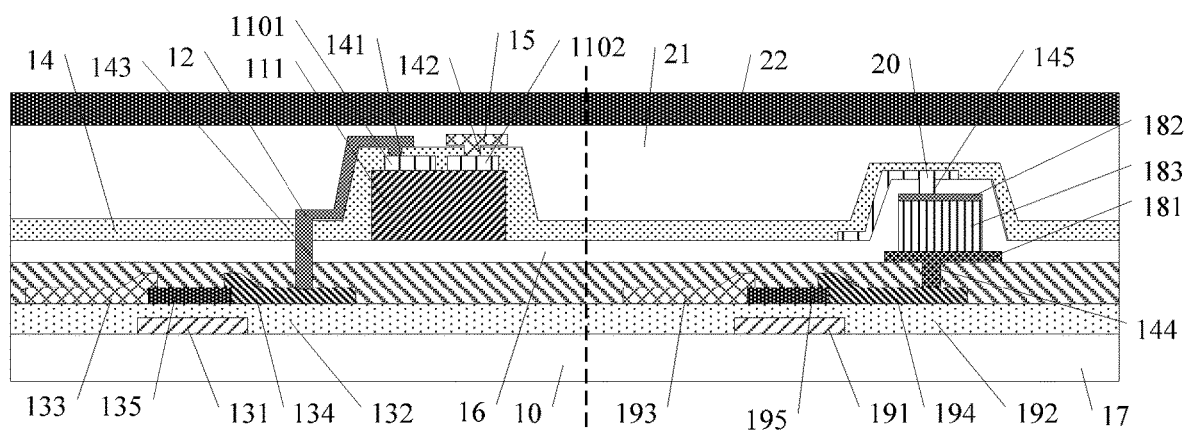

For example, as shown in FIG. 12J, an insulating layer film is deposited on the base substrate 10 on which the first connection electrode 12 and the second connection electrode 15 are formed to form the flat layer 21; and the hydrophobic layer 22 is formed on the flat layer 21.

For example, chemical vapor deposition (CVD), such as plasma enhanced chemical vapor deposition (PECVD), low pressure chemical vapor deposition (LPCVD), and the like, and physical vapor deposition (PVD), and the like can be used for depositing the insulating layer film and the semiconductor layer film. The metal thin film may be deposited by a vapor deposition method, a magnetron sputtering method, a vacuum evaporation method, or other suitable processes. However, the embodiments of the present disclosure are not limited to these specific methods.

It should be noted that the related description of the acoustic wave generation device, the first switching element, the signal detection device, the second switching element, etc. can refer to the detailed description of the related devices in the microfluidic substrate in the above-mentioned embodiment of the microfluidic substrate, and the repetitions will not be repeated here again.

For the present disclosure, the following points need to be explained:

(1) The drawings of the embodiments of the present disclosure only refer to the structures related to the embodiments of the present disclosure, and other structures may refer to the general design.

(2) In case of no conflict, the embodiments of the present disclosure and the features in the embodiments can be combined with each other to obtain new embodiments.

What have been described above merely are specific implementations of the present disclosure, but the protective scope of the present disclosure is not limited to this case. The protective scope of the present disclosure is determined by the appended claims.

What is claimed is:

1. A microfluidic substrate, comprising a base substrate, an acoustic wave generation device, and a first switching circuit,
   wherein the acoustic wave generation device is on the base substrate and is configured to emit an acoustic wave to drive a liquid droplet to move over the microfluidic substrate,
   the acoustic wave generation device comprises an acoustic wave driving electrode and an acoustic wave generation layer,
   the first switching circuit is on the base substrate and electrically connected to the acoustic wave driving electrode, and is configured to transmit an acoustic wave driving signal to the acoustic wave driving electrode, and
   the acoustic wave driving electrode is configured to drive the acoustic wave generation layer to generate the acoustic wave under control of the acoustic wave driving signal;
   the microfluidic substrate further comprises a first connection electrode and a first protective layer, which are on the base substrate, wherein the acoustic wave driving electrode is located on a side of the acoustic wave generation layer away from the base substrate and comprises at lease one first sub-electrode; the first protective layer is located on a side of the acoustic wave generation device away from the base substrate and comprises at least one first via hole, and each first via hole of the at least one first via hole expose a portion of a corresponding first sub-electrode; the first connection electrode is located on a side of the first protective layer away from the acoustic wave generation device, and is electrically connected to the at least one first sub-electrode through the at lease one first via hole; and the first switching circuit is electrically connected to the at least one first sub-electrode through the first connection electrode; or
   the microfluidic substrate further comprises a first composite electrode and a first protective layer, which are on the base substrate, wherein the acoustic wave driving electrode comprises at least one first sub-electrode; the first protective layer is located on a side of the acoustic wave generation layer away from the base substrate and comprises at least one first groove, and the at least one first groove exposes a first portion of the acoustic wave generation layer; the first composite electrode is located on a side of the first protective layer away from the acoustic wave generation layer and covers the at least one first groove, a portion of the first composite electrode located in the at least one first groove is the at least one first sub-electrode, and a portion of the first composite electrode located outside the at least one first groove is a first connection electrode; and the first switching circuit is electrically connected to the first connection electrode.

2. The microfluidic substrate according to claim 1, wherein an orthographic projection of each first via hole on the base substrate is located within an orthographic projection of the corresponding first sub-electrode on the base substrate.

3. The microfluidic substrate according to claim 1, further comprising a second connection electrode,
   wherein the acoustic wave driving electrode further comprises at least one second sub-electrode, and the at least one first sub-electrode and the at least one second sub-electrode are electrically insulated from each other;
   the first protective layer further comprises at least one second via hole, and each second via hole of the at least one second via hole exposes a portion of a corresponding second sub-electrode; and
   the second connection electrode is located on the side of the first protective layer away from the acoustic wave generation device, and is electrically connected to the at least one second sub-electrode through the at least one second via hole, and is configured to provide a common voltage signal to the at least one second sub-electrode.

4. The microfluidic substrate according to claim 3, wherein an orthographic projection of each second via hole on the base substrate is located within an orthographic projection of the corresponding second sub-electrode on the base substrate.

5. The microfluidic substrate according to claim 3, wherein the acoustic wave driving electrode comprises a plurality of first sub-electrodes and a plurality of second sub-electrodes,
   the plurality of first sub-electrodes and the plurality of second sub-electrodes are alternately arranged, and the plurality of first sub-electrodes and the plurality of second sub-electrodes are parallel to each other.

6. The microfluidic substrate according to claim 1, further comprising a second composite electrode, wherein the acoustic wave driving electrode further comprises at least one second sub-electrode, the first protective layer further comprises at least one second groove, and the at least one second groove exposes a second portion of the acoustic wave generation layer;
the second composite electrode is located on the side of the first protective layer away from the acoustic wave generation layer and covers the at least one second groove, a portion of the second composite electrode located in the at least one second groove is the at least one second sub-electrode, and a portion of the second composite electrode located outside the at least one second groove is a second connection electrode; and
the second connection electrode is configured to receive a common voltage signal.

7. The microfluidic substrate according to claim further comprising a second protective layer and a third via hole,
wherein the second protective layer is located on the first switching circuit;
the acoustic wave generation device is located on the second protective layer and on a side of the second protective layer away from the first switching circuit;
the first protective layer also covers the second protective layer;
the third via hole penetrates through the second protective layer and the first protective layer and exposes a portion of the first switching circuit; and
the first connection electrode is electrically connected to the first switching circuit through the third via hole.

8. The microfluidic substrate according to claim 7, further comprising a signal detection device and a second switching circuit, which are on the base substrate,
wherein the signal detection device is electrically connected to the second switching circuit, and
the first protective layer also covers the signal detection device and the second switching circuit.

9. The microfluidic substrate according to claim 8, further comprising a passivation layer,
wherein the signal detection device comprises a semiconductor stack layer, a first driving electrode, and a second driving electrode;
the passivation layer covers the second switching circuit, the first driving electrode is located on a side of the passivation layer away from the second switching circuit, the semiconductor stack layer is located on a side of the first driving electrode away from the passivation layer, the second driving electrode is located on a side of the semiconductor stack layer away from the first driving electrode, and the second protective layer covers the second driving electrode; and
the passivation layer comprises a fourth via hole, and the first driving electrode is electrically connected to the second switching circuit through the fourth via hole.

10. The microfluidic substrate according to claim 9, further comprising a detection signal line,
wherein the second protective layer comprises a fifth via hole, and the fifth via hole exposes a portion of the second driving electrode; and
the detection signal line is located on a side of the second protective layer away from the second driving electrode and is electrically connected to the second driving electrode through the fifth via hole.

11. The microfluidic substrate according to claim 10, wherein the detection signal line and the acoustic wave driving electrode are on a same layer and are manufactured by a same material.

12. The microfluidic substrate according to claim 1, wherein the acoustic wave generation layer comprises a piezoelectric material, and the acoustic wave driving electrode is configured to drive the piezoelectric material in the acoustic wave generation layer to generate the acoustic wave.

13. A microfluidic panel, comprising a microfluidic substrate, a controller, and a signal processing circuit,
wherein the microfluidic substrate comprises a base substrate, an acoustic wave generation device, a signal detection device, and a first switching circuit,
the acoustic wave generation device is on the base substrate and is configured to emit an acoustic wave to drive a liquid droplet to move over the microfluidic substrate,
the acoustic wave generation device comprises an acoustic wave driving electrode and an acoustic wave generation layer,
the first switching circuit is on the base substrate and electrically connected to the acoustic wave driving electrode, and is configured to transmit an acoustic wave driving signal to the acoustic wave driving electrode, and
the acoustic wave driving electrode is configured to drive the acoustic wave generation layer to generate the acoustic wave under control of the acoustic wave driving signal;
the microfluidic substrate further comprises a first connection electrode and a first protective layer, which are on the base substrate, wherein the acoustic wave driving electrode is located on a side of the acoustic wave generation layer away from the base substrate and comprises at lease one first sub-electrode; the first protective layer is located on a side of the acoustic wave generation device away from the base substrate and comprises at least one first via hole, and each first via hole of the at least one first via hole expose a portion of a corresponding first sub-electrode; the first connection electrode is located on a side of the first protective layer away from the acoustic wave generation device, and is electrically connected to the at least one first sub-electrode through the at lease one first via hole; and the first switching circuit is electrically connected to the at least one first sub-electrode through the first connection electrode; or
the microfluidic substrate further comprises a first composite electrode and a first protective layer, which are on the base substrate, wherein the acoustic wave driving electrode comprises at least one first sub-electrode; the first protective layer is located on a side of the acoustic wave generation layer away from the base substrate and comprises at least one first groove, and the at least one first groove exposes a first portion of the acoustic wave generation layer; the first composite electrode is located on a side of the first protective layer away from the acoustic wave generation layer and covers the at least one first groove, a portion of the first composite electrode located in the at least one first groove is the at least one first sub-electrode, and a portion of the first composite electrode located outside the at least one first groove is a first connection electrode; and the first switching circuit is electrically connected to the first connection electrode;
wherein the controller is coupled with the acoustic wave generation device in the microfluidic substrate to control the acoustic wave generation device to emit the acoustic wave; and the signal processing circuit is coupled with the signal detection device in the microfluidic substrate to control the signal detection device to perform detection and process on a detection signal obtained by the signal detection device.

14. A manufacture method for manufacturing a microfluidic substrate, comprising:
providing a base substrate; and
forming an acoustic wave generation device and a first switching circuit on the base substrate, wherein the acoustic wave generation device is configured to emit an acoustic wave to drive a liquid droplet to move over the microfluidic substrate, the acoustic wave generation device comprises an acoustic wave driving electrode and an acoustic wave generation layer, the first switching circuit is electrically connected to the acoustic wave driving electrode, the first switching circuit is configured to transmit an acoustic wave driving signal to the acoustic wave driving electrode, and the acoustic wave driving electrode is configured to drive the acoustic wave generation layer to generate the acoustic wave under control of the acoustic wave driving signal;
the manufacture further comprises: forming the acoustic wave generation device on the base substrate on which the first switching circuit is formed, wherein the acoustic wave driving electrode is located on a side of the acoustic wave generation layer away from the base substrate, and comprises at least one first sub-electrode; forming a first protective layer, wherein the first protective layer is located on a side of the acoustic wave generation device away from the base substrate, the first protective layer comprises at least one first via hole, and each first via hole of the at least one first via hole exposes a portion of a corresponding first sub-electrode; and forming a first connection electrode on a side of the first protective layer away from the acoustic wave generation device, wherein the first connection electrode is electrically connected to the at least one first sub-electrode through the at least one first via hole, and the first switching circuit is electrically connected to the at least one first sub-electrode through the first connection electrode; or the manufacture method further comprises: forming the acoustic wave generation layer of the acoustic wave generation device on the base substrate on which the first switching circuit is formed; forming a first protective layer, wherein the first protected layer is located on a side of the acoustic wave generation layer away from the base substrate and comprises at least one first groove, and the at least one first groove exposes a portion of the acoustic wave generation layer; and forming a first composite electrode on a side of the first protective layer away from the acoustic wave generation layer, wherein the first composite electrode covers the at least one first groove, the acoustic wave driving electrode comprises at least one first sub-electrode, a portion of the first composite electrode located in the at least one first groove is the at least one first sub-electrode, a portion of the first composite electrode located outside the at least one first groove is a first connection electrode, and the first switching circuit is electrically connected to the first connection electrode.

15. The manufacture method according to claim 14, further comprising:
forming a second switching circuit on the base substrate; and
forming a signal detection device on the base substrate on which the second switching circuit is formed, wherein the first protective layer also covers the signal detection device and the second switching circuit, and the signal detection device is electrically connected to the second switching circuit.

16. The manufacture method according to claim 15, further comprising:
forming a detection signal line on the base substrate, wherein the detection signal line is electrically connected to the signal detection device, and the detection signal line and the acoustic wave driving electrode are formed through one patterning process.

* * * * *

UNITED STATES PATENT AND TRADEMARK OFFICE
CERTIFICATE OF CORRECTION

| | | |
|---|---|---|
| PATENT NO. | : 11,794,185 B2 | Page 1 of 1 |
| APPLICATION NO. | : 16/761948 | |
| DATED | : October 24, 2023 | |
| INVENTOR(S) | : Haixu Li | |

It is certified that error appears in the above-identified patent and that said Letters Patent is hereby corrected as shown below:

In the Claims

Column 29, Line 16:
In Claim 7, after "claim", insert --1,-- therefor

Signed and Sealed this
Second Day of April, 2024

Katherine Kelly Vidal

Katherine Kelly Vidal
*Director of the United States Patent and Trademark Office*